US012495590B2

(12) United States Patent
Kim et al.

(10) Patent No.: US 12,495,590 B2
(45) Date of Patent: Dec. 9, 2025

(54) SEMICONDUCTOR DEVICE

(71) Applicant: Samsung Electronics Co., Ltd., Suwon-si (KR)

(72) Inventors: Da Hye Kim, Suwon-si (KR); Jin Bum Kim, Suwon-si (KR); Gyeom Kim, Suwon-si (KR); Young Kwang Kim, Suwon-si (KR); Kyung Bin Chun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 294 days.

(21) Appl. No.: 18/313,630

(22) Filed: May 8, 2023

(65) Prior Publication Data

US 2024/0145541 A1    May 2, 2024

(30) Foreign Application Priority Data

Oct. 27, 2022  (KR) .................. 10-2022-0140166

(51) Int. Cl.
*H10D 62/10*     (2025.01)
*H10D 30/43*     (2025.01)
*H10D 30/67*     (2025.01)

(52) U.S. Cl.
CPC .......... *H10D 62/121* (2025.01); *H10D 30/43* (2025.01); *H10D 30/6735* (2025.01); *H10D 30/6757* (2025.01)

(58) Field of Classification Search
None
See application file for complete search history.

(56) References Cited

U.S. PATENT DOCUMENTS

| | | |
|---|---|---|
| 11,227,917 B1 | 1/2022 | Chung et al. |
| 11,251,313 B2 | 2/2022 | Kang et al. |
| 2021/0066477 A1 | 3/2021 | Lee et al. |
| 2021/0296499 A1 | 9/2021 | Jang et al. |
| 2022/0045198 A1 | 2/2022 | Li et al. |
| 2022/0059703 A1 | 2/2022 | More |
| 2022/0181498 A1 | 6/2022 | Kim et al. |
| 2022/0223698 A1 | 7/2022 | Xie et al. |

FOREIGN PATENT DOCUMENTS

KR     2003-0007758 A    1/2003

*Primary Examiner* — Anthony Ho
(74) *Attorney, Agent, or Firm* — Harness, Dickey & Pierce, P.L.C.

(57) ABSTRACT

A semiconductor device includes an active pattern including a lower pattern extending in a first direction, and a plurality of sheet patterns spaced apart from the lower pattern in a second direction. The sheet patterns include an uppermost sheet pattern and a plurality of gate structures on the lower pattern and spaced apart from each other in the first direction. Each of the plurality of gate structures includes a gate electrode and a gate insulating film and a source/drain pattern between adjacent ones of the plurality of gate structures. Each of inner gate structures includes a gate electrode and a gate insulating film. A semiconductor liner film includes silicon-germanium, and contacts the gate insulating film of each of the inner gate structures. A portion of the semiconductor liner film protrudes upwardly in the first direction beyond an upper surface of the uppermost sheet pattern.

20 Claims, 38 Drawing Sheets

SEMICONDUCTOR DEVICE

CROSS-REFERENCE TO RELATED APPLICATION

This application claims priority from Korean Patent Application No. 10-2022-0140166 filed on Oct. 27, 2022 in the Korean Intellectual Property Office, and all the benefits accruing therefrom under 35 U.S.C. 119, the contents of which in its entirety are herein incorporated by reference.

BACKGROUND

Various example embodiments relate to a semiconductor device, and more specifically, to a semiconductor device including a MBCFET™ (Multi-Bridge Channel Field Effect) Transistor.

One of scaling schemes for increasing an integration density of a semiconductor device proposes a multi-gate transistor in which a multi-channel active pattern (e.g., a silicon body) in a shape of a fin or a nanowire is formed on a substrate, and a gate is formed on a surface of the multi-channel active pattern.

Because such a multi-gate transistor uses a three-dimensional channel, it may be easier to scale (e.g. to shrink) the same. Additionally or alternatively, current control capability of the multi-gate transistor may be improved without increasing or with minimally increasing a gate length of the multi-gate transistor. Alternatively or additionally, the multi-gate transistor may more effectively suppress SCE (short channel effect) in which potential of a channel area is affected by drain voltage.

SUMMARY

Various example embodiments may provide a semiconductor device capable of improving element performance and/or reliability.

However, features of various example embodiments are not limited thereto. Other purposes and/or advantages that are not mentioned may be understood based on following descriptions and/or may be more clearly understood based on various example embodiments. Alternatively or additionally, it may be easily understood that the purposes and advantages may be realized using examples shown in the claims and combinations thereof.

According to some example embodiments, there is provided a semiconductor device comprising an active pattern including a lower pattern extending in a first direction, and a plurality of sheet patterns spaced apart from the lower pattern in a second direction, wherein the plurality of sheet patterns include a uppermost sheet pattern a plurality of gate structures on the lower pattern and spaced apart from each other in the first direction, wherein each of the plurality of gate structures includes a gate electrode and a gate insulating film, the semiconductor device further includes a source/drain pattern between adjacent ones of the plurality of gate structures, wherein the source/drain pattern includes a semiconductor liner film and a semiconductor filling film on the semiconductor liner film, wherein at least one of the plurality of gate structures includes an inner gate structure between the lower pattern and a lowermost sheet pattern among the plurality of sheet patterns, and an inner gate structure between adjacent ones of the plurality of sheet patterns, wherein each of the inner gate structures includes the gate electrode and the gate insulating film, wherein the semiconductor liner film includes silicon-germanium, and is in contact with the gate insulating film of each of the inner gate structures, wherein a portion of the semiconductor liner film protrudes upwardly in the first direction beyond an upper surface of the uppermost sheet pattern.

Alternatively or additionally according to various example embodiments, there is provided a semiconductor device comprising an active pattern including a lower pattern extending in a first direction, and a plurality of sheet patterns spaced apart from the lower pattern in a second direction, wherein the plurality of sheet patterns include a uppermost sheet pattern a plurality of gate structures on the lower pattern and spaced apart from each other in the first direction, wherein each of the plurality of gate structures includes a gate spacer, a gate electrode and a gate insulating film and a source/drain pattern disposed between adjacent ones of the plurality of gate structures, wherein the source/drain pattern includes a semiconductor liner film and a semiconductor filling film on the semiconductor liner film, wherein the gate spacer includes an inner sidewall facing a sidewall of the gate electrode, an outer sidewall opposite to the inner sidewall of the gate spacer, and a connection sidewall connecting the inner sidewall of the gate spacer and the outer sidewall of the gate spacer to each other, wherein each of the semiconductor liner film and the semiconductor filling film includes silicon-germanium, wherein a fraction of germanium in the semiconductor liner film is less than a fraction of germanium in the semiconductor filling film, wherein a height from an upper surface of the lower pattern to an upper surface of the uppermost sheet pattern is smaller than a height from the upper surface of the lower pattern to a uppermost level of the semiconductor liner film, and wherein in a plan view of the semiconductor device, the semiconductor liner film covers at least a portion of the outer sidewall of the gate spacer.

Alternatively or additionally according to various example embodiments, there is provided a semiconductor device comprising an active pattern including a lower pattern extending in a first direction, and a plurality of sheet patterns spaced apart from the lower pattern in a second direction, wherein the plurality of sheet patterns include a uppermost sheet pattern a plurality of gate structures on the lower pattern and spaced apart from each other in the first direction, wherein each of the plurality of gate structures includes a gate electrode and a gate insulating film, and a source/drain pattern between adjacent ones of the plurality of gate structures, wherein the source/drain pattern includes a semiconductor liner film and a semiconductor filling film on the semiconductor liner film, wherein a height from an upper surface of the lower pattern to an upper surface of the uppermost sheet pattern is less than a height from the upper surface of the lower pattern to a uppermost level of the semiconductor liner film, wherein each of the semiconductor liner film and the semiconductor filling film includes silicon-germanium, wherein a fraction of germanium in the semiconductor liner film is less than a fraction of germanium in the semiconductor filling film, wherein the semiconductor liner film includes an outer surface contacting the sheet patterns and an inner surface facing the semiconductor filling film, wherein a liner recess defined by the inner surface of the semiconductor liner film includes a plurality of width extension areas, wherein a width in the first direction of each of the width extension areas increases and then decreases as each of the width extension areas extends away from the upper surface of the lower pattern.

It should be noted that effects of various example embodiments are not limited to those described above, and other effects of the present disclosure will be apparent from the following description.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Although first, second, etc. are used to describe various elements or components, these elements or components are not limited by these terms. These terms are only used to distinguish one element or component form another. Therefore, the first element or component mentioned below may be the second element or component within the technical idea of example embodiments.

A semiconductor device according to some example embodiments may include one or more of a fin-type transistor (FinFET), a tunneling transistor (tunneling FET), a 3-dimensional (3D) transistor, or a vertical transistor (vertical FET). A semiconductor device according to some example embodiments may include a planar transistor. Alternatively or additionally, example embodiments may be applied to a transistor (2D material-based FET) based on a 2D material, and a heterostructure thereof.

Alternatively or additionally, the semiconductor device according to some example embodiments may include one or more of a bipolar junction transistor, a LDMOS (lateral double diffused metal oxide semiconductor) transistor, and the like.

With reference to FIG. 1 to FIG. 10, descriptions will be made of a semiconductor device according to some example embodiments.

Figure 1:
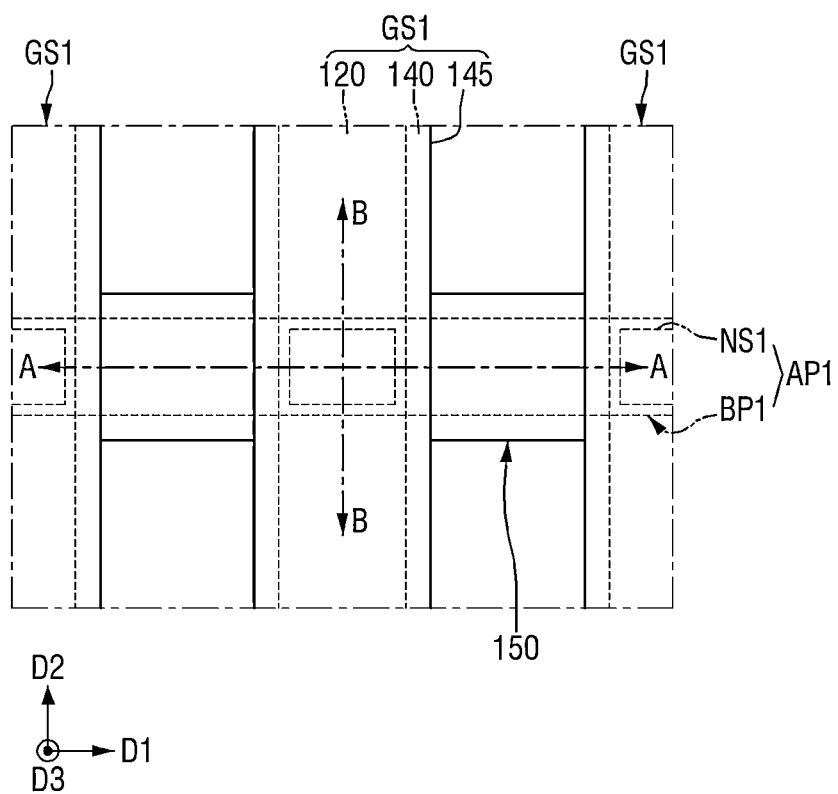
FIG. 1 is an example plan view for explaining a semiconductor device according to some example embodiments.
Figure 2:
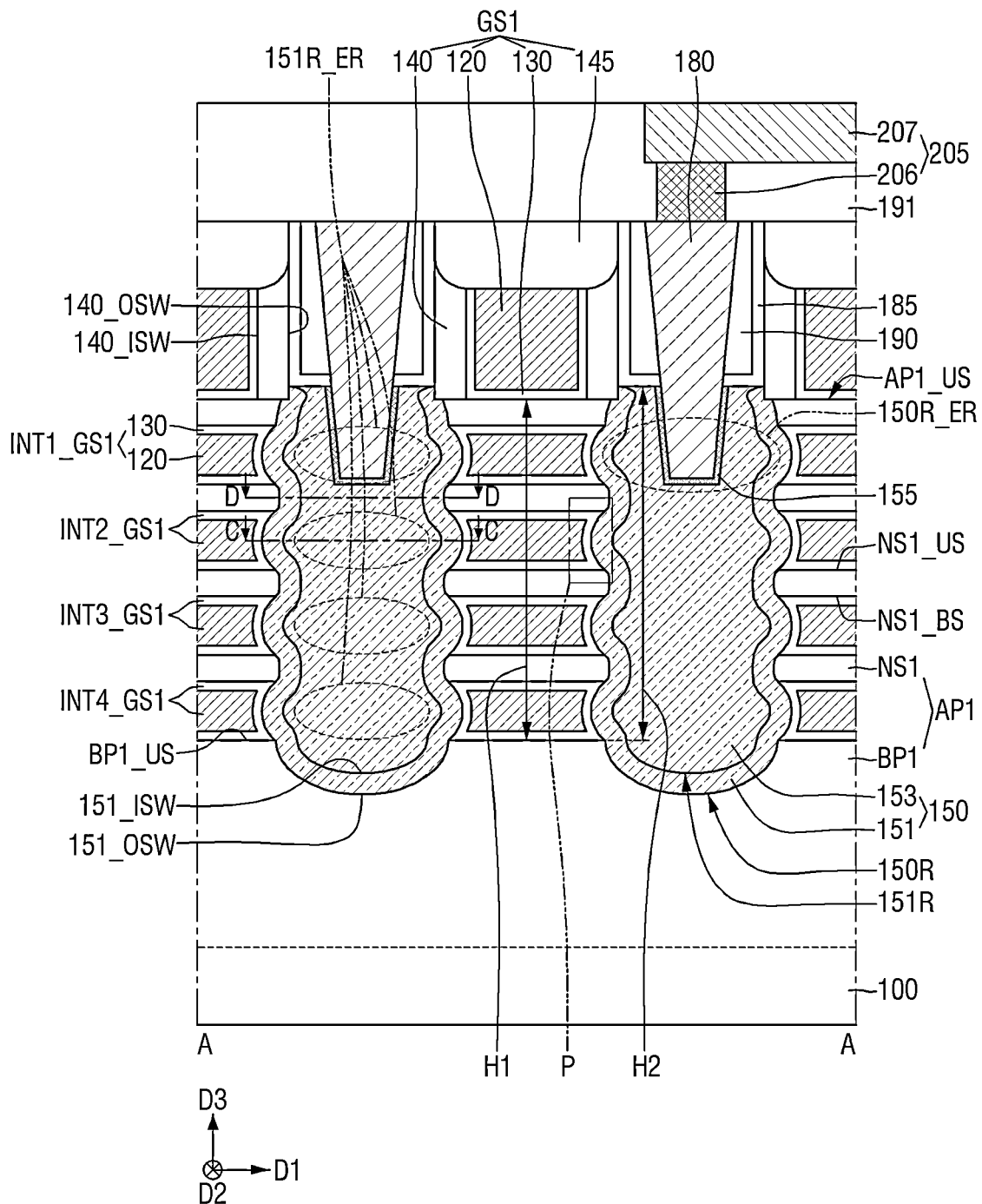
FIG. 2 and FIG. 3 are cross-sectional views taken along A-A and B-B of FIG. 1.
Figure 3:
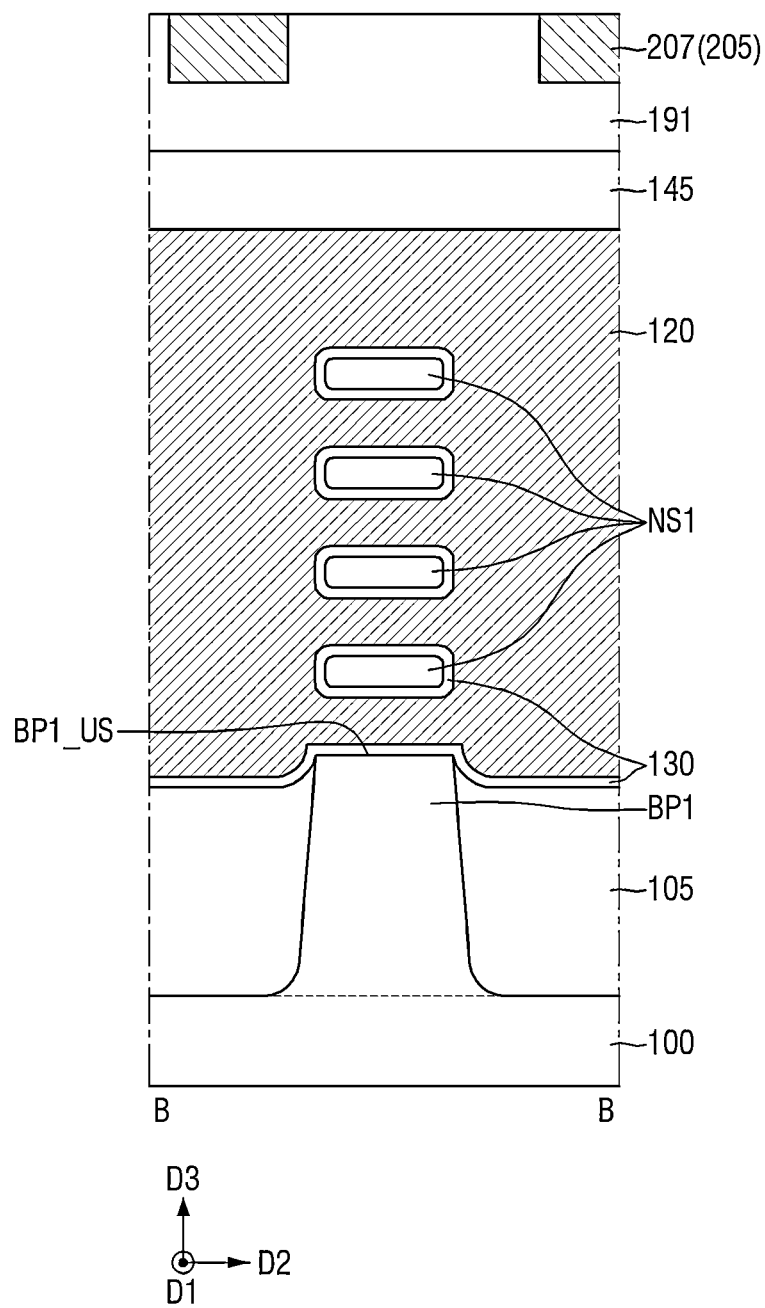
Figure 4:
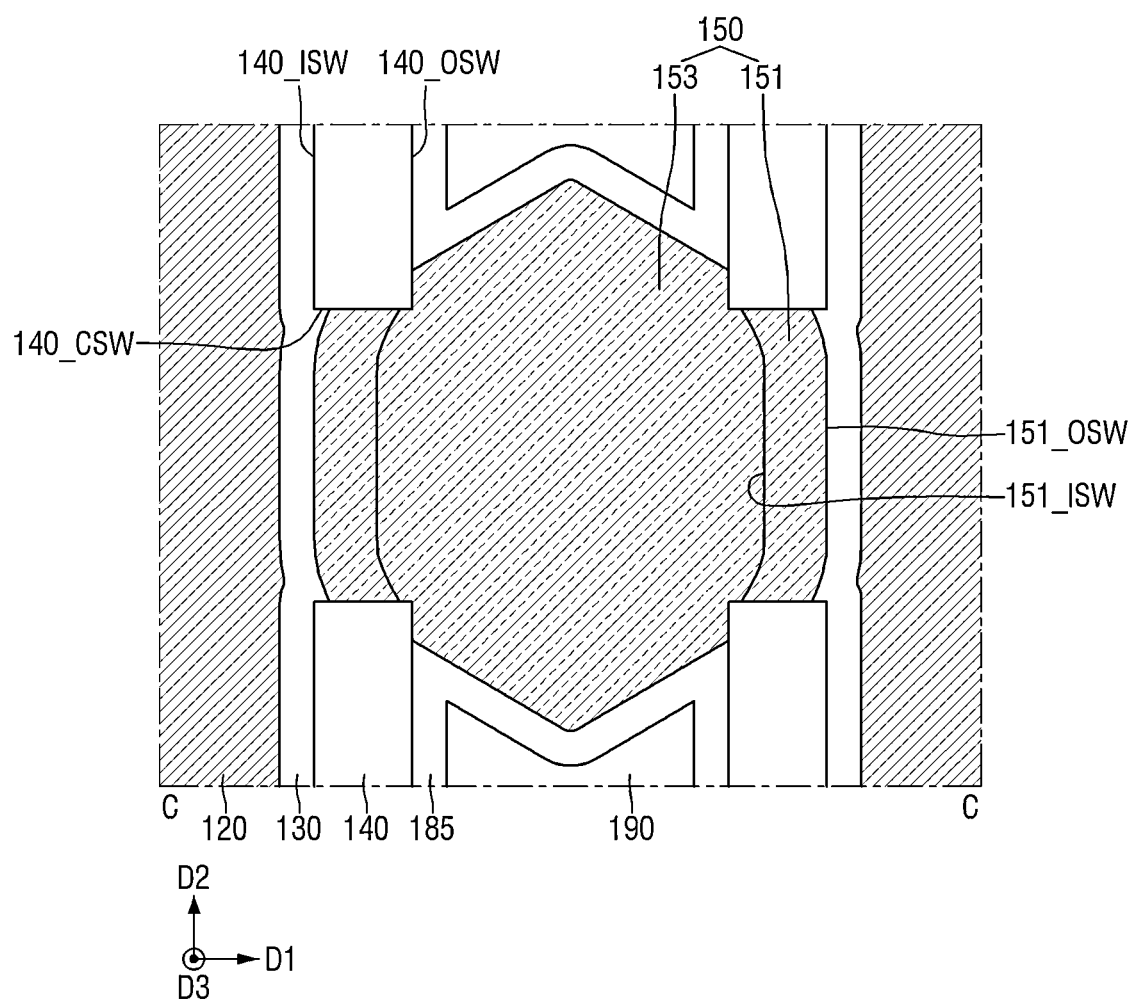
FIG. 4 is a top view taken along C-C of FIG. 2.
Figure 5:
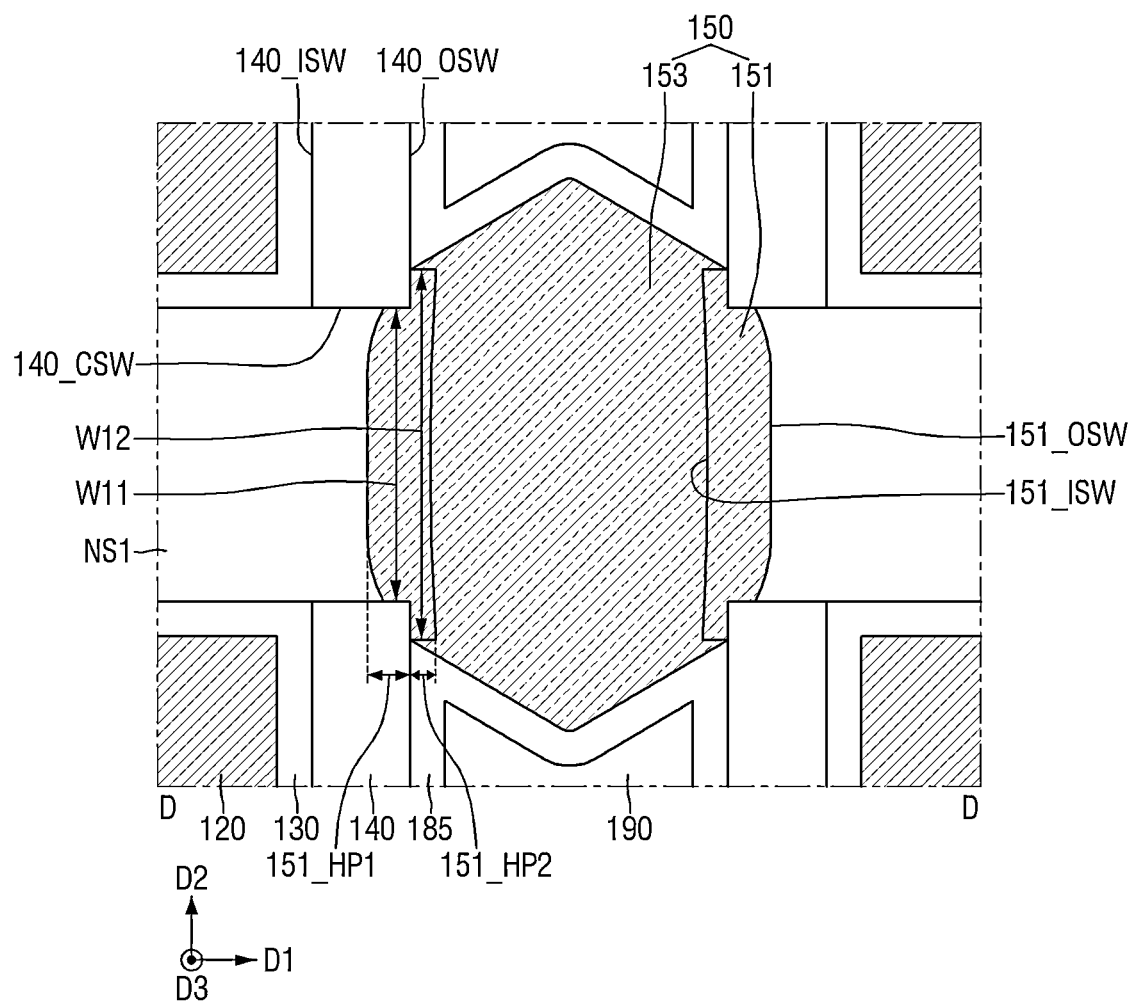
FIG. 5 and FIG. 6 are top views taken along line D-D of FIG. 2.
Figure 6:
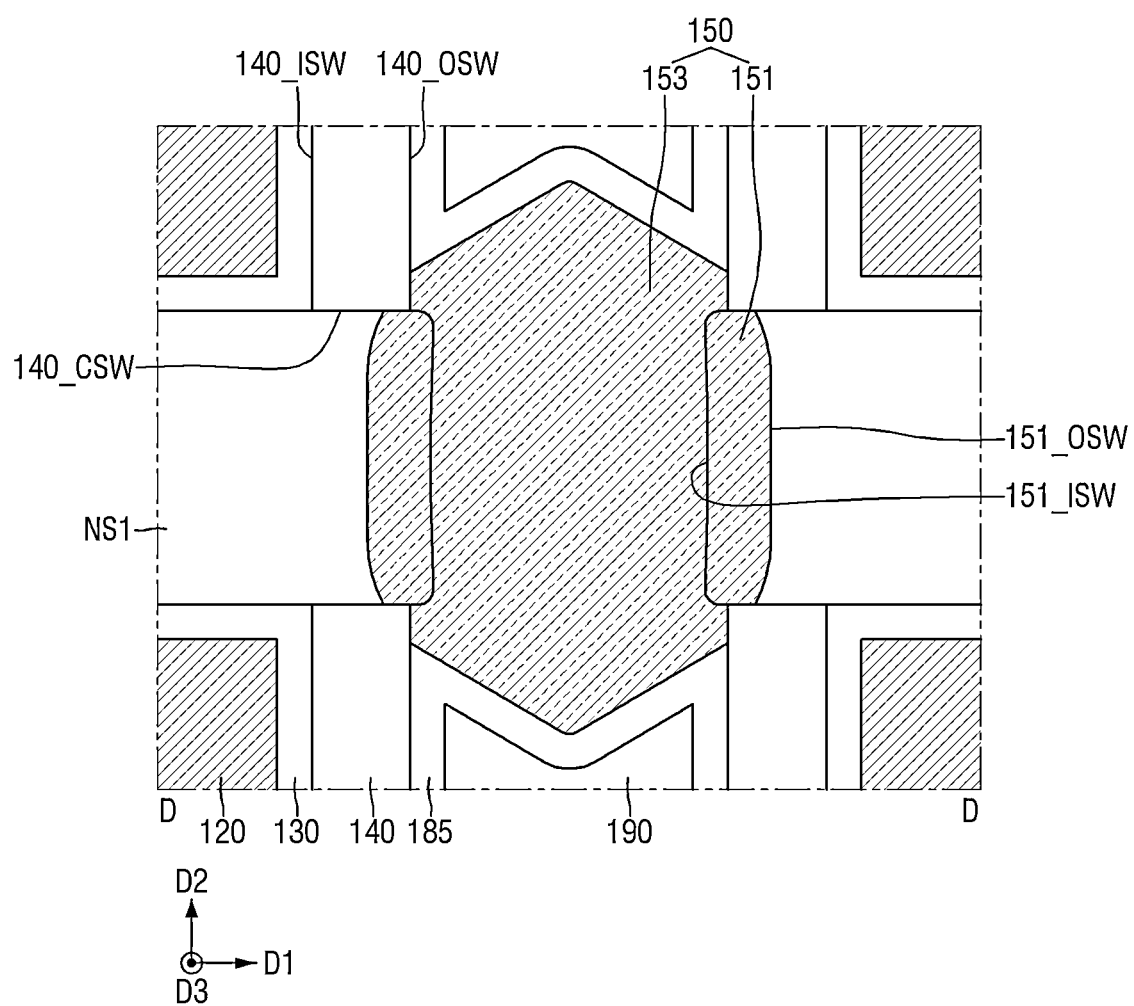
Figure 7:
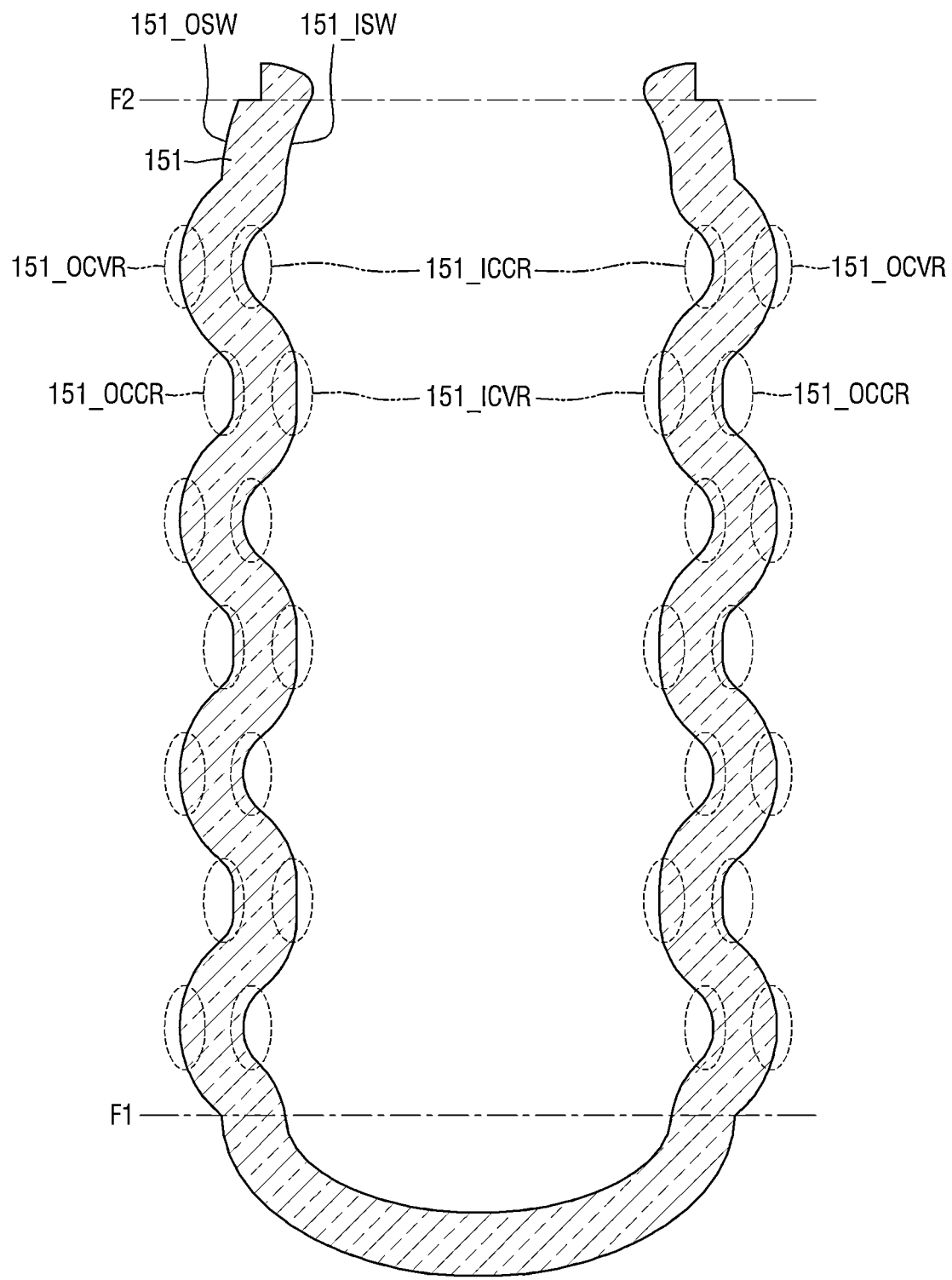
FIG. 7 is a diagram for explaining a shape of a semiconductor liner film in FIG. 2.
Figure 8:
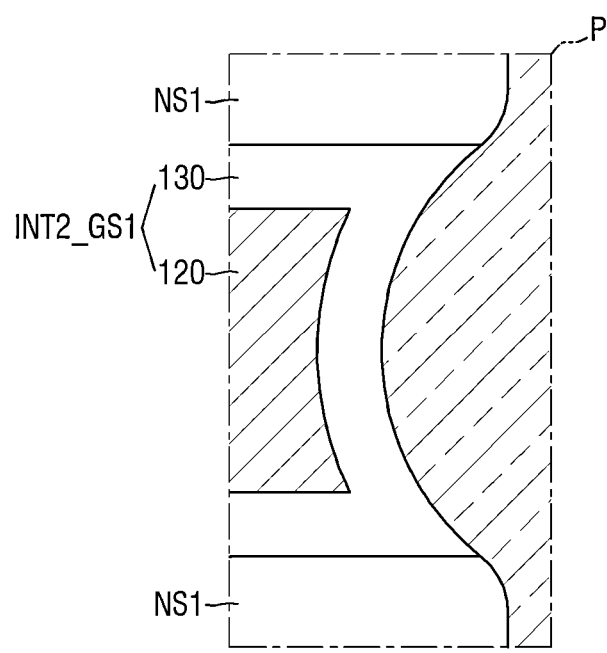
FIGS. 8 to 10 are enlarged views of a P area of FIG. 2, respectively.
Figure 9:
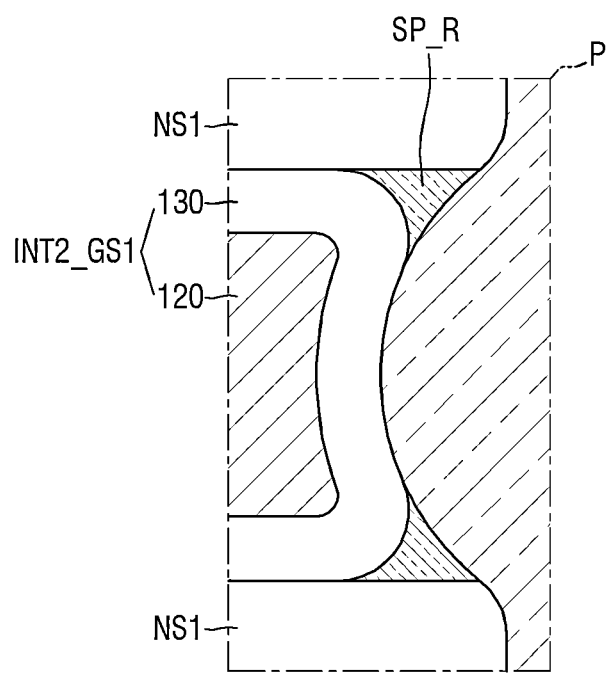
Figure 10:
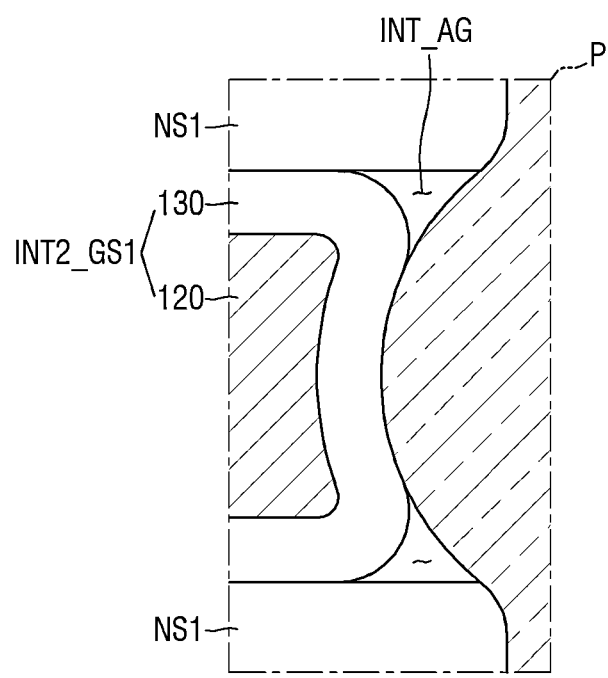
Figure 11:
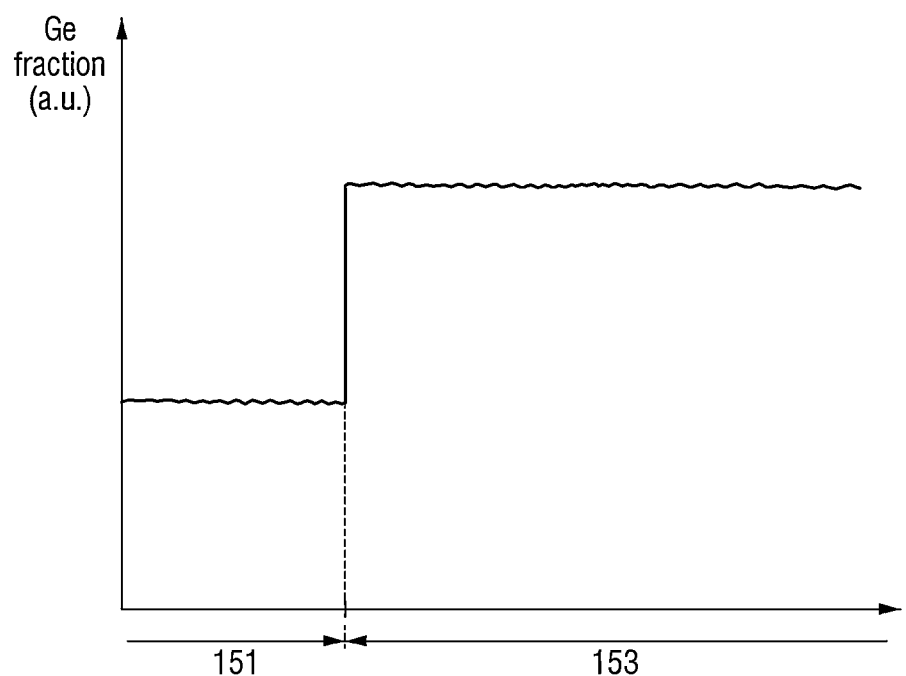
FIG. 11 is a diagram for explaining a fraction of germanium in a first source/drain pattern of FIG. 2.

FIG. 1 is an illustrative plan view for explaining a semiconductor device according to some example embodiments. FIG. 2 and FIG. 3 are cross-sectional views taken along A-A and B-B of FIG. 1. FIG. 4 is a top view taken along C-C of FIG. 2. FIG. 5 and FIG. 6 are top views taken along line D-D of FIG. 2. FIG. 7 is a diagram to explain a shape of a semiconductor liner film in FIG. 2. FIGS. 8 to 10 are enlarged views of a P area of FIG. 2, respectively. FIG. 11 is a diagram for explaining a fraction of germanium in a first source/drain pattern of FIG. 2.

For reference, FIG. 1 is shown briefly while a first gate insulating film 130, a first source/drain contact 180, a source/drain etch stop film 185, interlayer insulating films 190 and 191, and a wiring structure 205 are omitted.

Referring to FIGS. 1 to 11, a semiconductor device according to some example embodiments may include a first active pattern AP1, a plurality of first gate electrodes 120, a plurality of first gate structures GS1, and a first source/drain pattern 150.

The substrate 100 may be made of or may include bulk silicon or SOI (silicon-on-insulator). Alternatively or additionally, the substrate 100 may be embodied or may include as a silicon substrate, and/or may be made of a material other than silicon, such as one or more of silicon germanium, SGOI (silicon germanium on insulator), indium antimonide, lead telluride, indium arsenide, indium phosphide, gallium arsenide or gallium antimonide, but may not limited thereto.

The first active pattern AP1 may be disposed on the substrate 100. The first active pattern AP1 may extend in an elongated manner in the first direction D1. For example, the first active pattern AP1 may be disposed in an area where a PMOS is formed.

The first active pattern AP1 may be or may include, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend long in the first direction D1.

The plurality of first sheet patterns NS1 may be disposed on an upper surface BP1_US of the first lower pattern. The plurality of first sheet patterns NS1 may be spaced apart from the first lower pattern BP1 in the third direction D3. The first sheet patterns NS1 may be spaced apart from each other in the third direction D3. Thicknesses of and/or spacings between neighboring first nanosheet patterns NS1 in the third direction D3 may or may not be the same as each other. The third direction D3 may be a direction intersecting a plane defined by the first direction D1 and the second direction D2. For example, the third direction D3 may be a thickness direction of the substrate 100. The first direction D1 may be a direction intersecting the second direction D2.

Each of the first sheet patterns NS1 may include an upper surface NS1_US and a bottom surface NS1_BS. The upper surface NS1_US of the first sheet pattern is opposite to the bottom surface NS1_BS of the first sheet pattern in the third direction D3. The bottom surface NS1_BS of the first sheet pattern faces the upper surface BP1_US of the first lower pattern.

The first sheet pattern NS1 may include a first uppermost sheet pattern. For example, the upper surface AP1_US of the first active pattern may be an upper surface of the first uppermost sheet pattern NS1.

Although it is illustrated that four first sheet patterns NS1 are arranged in the third direction D3, this is intended for convenience of explanation. However, example embodiments are not limited thereto.

The first lower pattern BP1 may be formed by etching a portion of the substrate 100, or may include an epitaxial layer, such as a heterogeneous and/or homogeneous epitaxial layer, grown from the substrate 100. The first lower pattern BP1 may include silicon and/or germanium as an elemental semiconductor material. Further, the first lower pattern BP1 may include a compound semiconductor, for example, a group IV-IV compound semiconductor and/or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping (e.g., implanting) a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

The first sheet pattern NS1 may include one of silicon or germanium as an elemental semiconductor material, a group IV-IV compound semiconductor, or a group III-V compound semiconductor. Each of the first sheet patterns NS1 may include the same material as that of the first lower pattern BP1, and/or may include a material other than that of the first lower pattern BP1.

In the semiconductor device according to some example embodiments, the first lower pattern BP1 may be or may include a silicon lower pattern including silicon, while the first sheet pattern NS1 may be or may include a silicon sheet pattern including silicon.

A width in the second direction D2 of the first sheet pattern NS1 may be increased or decreased in proportion to a width in the second direction D2 of the first lower pattern BP1. In some examples, it is illustrated that the widths in the second direction D2 of the first sheet patterns NS1 arranged in the third direction D3 are equal to each other. However, this is intended for convenience of explanation and example embodiments are not limited thereto. Unlike what is illustrated, as vertical levels of the first sheet patterns NS1 based on the first lower pattern BP1 increases, the widths in the second direction D2 of the first sheet patterns NS1 stacked in the third direction D3 may decrease.

A field insulating film 105 may be formed on the substrate 100. The field insulating film 105 may be disposed on a sidewall of the first lower pattern BP1. The field insulating film 105 is not disposed on the upper surface BP1_US of the first lower pattern.

In some examples, the field insulating film 105 may cover an entirety of a sidewall of the first lower pattern BP1. Unlike what is shown, the field insulating film 105 may cover a portion of a sidewall of the first lower pattern BP1. In this case, a portion of the first lower pattern BP1 may protrude upwardly in the third direction D3 beyond an upper surface of the field insulating film 105.

A vertical level of each of the first sheet patterns NS1 is higher than that of the upper surface of the field insulating film 105. The field insulating film 105 may include, for example, an oxide film, a nitride film, an oxynitride film, or a combination thereof. Although the field insulating film 105 is illustrated as being embodied as a single film, this is intended for convenience of explanation and example embodiments are not limited thereto.

The plurality of first gate structures GS1 may be disposed on the substrate 100. Each of the first gate structures GS1 may extend in the second direction D2. The first gate structures GS1 may be disposed to be spaced apart from each other in the first direction D1. The first gate structures GS1 may be adjacent to each other in the first direction D1. For example, the first gate structure GS1 may be disposed on each of both sides of a first source/drain pattern 150 in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may surround each of the first sheet patterns NS1.

The first gate structure GS1 may include, for example, a first gate electrode 120, a first gate insulating film 130, a first gate spacer 140, and a first gate capping pattern 145.

The first gate structures GS1 may include a plurality of inner gate structures INT1_GS1, INT2_GS1, INT3_GS1, and INT4_GS1 respectively disposed between adjacent ones of the first sheet patterns NS1 adjacent to each other in the third direction D3 and between the first lower pattern BP and the first sheet pattern NS1. The inner gate structures INT1_GS1, INT2_GS1, INT3_GS1, and INT4_GS1 may be respectively disposed between the upper surface BP1_US of the first lower pattern BP1 and a bottom surface NS1_BS of the lowest first sheet pattern, and an upper surface NS1_US of any first sheet pattern and a bottom surface NS1_BS of another first sheet pattern adjacent thereto in the third direction D3.

The number of the inner gate structures INT1_GS1, INT2_GS1, INT3_GS1, and INT4_GS1 may be proportional to the number of the first sheet patterns NS1 included in the active pattern AP1. For example, the number of the inner gate structures INT1_GS1, INT2_GS1, INT3_GS1, and INT4_GS1 may be equal to the number of the first sheet patterns NS1. Since the first active pattern AP1 includes the plurality of first sheet patterns NS1, the first gate structure GS1 may include the plurality of inner gate structures.

The inner gate structures INT1_GS1, INT2_GS1, INT3_GS1, and INT4_GS1 contact the upper surface BP1_US of the first lower pattern, the upper surface NS1_US of the first sheet pattern, and the bottom surface NS1_BS of the first sheet pattern.

The inner gate structures INT1_GS1, INT2_GS1, INT3_GS1, and INT4_GS1 may contact the first source/drain pattern 150 to be described later. For example, the inner gate structures INT1_GS1, INT2_GS1, INT3_GS1, and INT4_GS1 may directly contact the first source/drain pattern 150.

Following description is made based on a case where the number of the inner gate structures INT1_GS1, INT2_GS1, INT3_GS1, and INT4_GS1 is 4.

The first gate structure GS1 may include a first inner gate structure INT1_GS1, a second inner gate structure INT2_GS1, a third inner gate structure INT3_GS1, and a fourth inner gate structure INT4_GS1. The first inner gate structure INT1_GS1, the second inner gate structure INT2_GS1, the third inner gate structure INT3_GS1, and the fourth inner gate structure INT4_GS1 may be sequentially and vertically disposed on the first lower pattern BP1. Although four inner gate structures are described, example embodiments are not limited thereto, and the number of inner gate structures may be greater or less than four.

The fourth inner gate structure INT4_GS1 may be disposed between the first lower pattern BP1 and the first sheet pattern NS1. The fourth inner gate structure INT4_GS1 may be disposed at the lowermost one of the inner gate structures INT1_GS1, INT2_GS1, INT3_GS1, and INT4_GS1. The fourth inner gate structure INT4_GS1 may be the lowest inner gate structure.

Each of the first inner gate structure INT1_GS1, the second inner gate structure INT2_GS1, and the third inner gate structure INT3_GS1 may be disposed between adjacent ones of the first sheet patterns NS1 adjacent to each other in the third direction D3. The first inner gate structure INT1_GS1 may be disposed at the uppermost part among the inner gate structures INT1_GS1, INT2_GS1, INT3_GS1, and INT4_GS1. The first inner gate structure INT1_GS1 may be the upper most inner gate structure. The second inner gate structure INT2_GS1 and the third inner gate structure INT3_GS1 are disposed between the first inner gate structure INT1_GS1 and the fourth inner gate structure INT4_GS1.

The inner gate structures INT1_GS1, INT2_GS1, INT3_GS1, and INT4_GS1 include a first gate electrode 120 and a first gate insulating film 130 disposed between the adjacent first sheet patterns NS1 and between the first lower pattern BP1 and the first sheet pattern NS1.

In some examples, a width in the first direction D1 of the first inner gate structure INT1_GS1 may be equal to a width in the first direction D1 of the second inner gate structure INT2_GS1. A width in the first direction D1 of the third inner gate structure INT3_GS1 may be equal to the width in the first direction D1 of the second inner gate structure INT2_GS1. A width in the first direction D1 of the fourth inner gate structure INT4_GS1 may be equal to the width in the first direction D1 of the third inner gate structure INT3_GS1.

In some examples, the width in the first direction D1 of the fourth inner gate structure INT4_GS1 may be greater than the width in the first direction D1 of the third inner gate structure INT3_GS1. The width in the first direction D1 of the first inner gate structure INT1_GS1 may be equal to the width in the first direction D1 of the second inner gate structure INT2_GS1. The width in the first direction D1 of the second inner gate structure INT2_GS1 may be equal to the width in the first direction D1 of the third inner gate structure INT3_GS1.

The second inner gate structure INT2_GS1 will be described by way of an example. The width of the second inner gate structure INT2_GS1 may be measured in a space between the upper surface NS1_US of the first sheet pattern and the bottom surface NS1_BS of the first sheet pattern facing each other in the third direction D3.

For reference, a plan view at a level of the second inner gate structure INT2_GS1 is shown in FIG. 4. Although not shown, when a portion where the first source/drain contact 180 is formed is excluded, a plan view at a level of each of other inner gate structures INT1_GS1, INT3_GS1, and INT4_GS1 may be similar to that of FIG. 4.

Further, a plan view at a level of a middle first sheet pattern NS1 among the four first sheet patterns NS1 is shown in FIG. 5 and FIG. 6. Although not shown, when a portion in which the first source/drain contact 180 is formed is excluded, a plan view at a level of each of other first sheet patterns NS1 may be similar to that of each of FIG. 5 or FIG. 6.

The first gate electrode 120 may be formed on the first lower pattern BP1. The first gate electrode 120 may intersect the first lower pattern BP1. The first gate electrode 120 may surround the first sheet pattern NS1. A portion of the first gate electrode 120 may be disposed between the first sheet patterns NS1 adjacent to each other in the third direction D3 and between the first lower pattern BP1 and the first sheet pattern NS1.

The first gate electrode 120 may include at least one of a metal, a metal alloy, a conductive metal nitride, a metal silicide, a doped semiconductor material such as doped polysilicon, a conductive metal oxide, and a conductive metal oxynitride. The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. Example embodiments are not limited thereto. The conductive metal oxide and the conductive metal oxynitride may include oxidized products (e.g., thermally oxidized products) of the above-mentioned materials. Example embodiments are not limited thereto.

The first gate electrode 120 may be disposed on each of, e.g. both sides of the first source/drain pattern 150 to be described later. The first gate structure GS1 may be disposed on both sides of the first source/drain pattern 150 in the first direction D1.

In some examples, both the first gate electrodes 120 disposed on both sides of the first source/drain pattern 150 may be normal gate electrodes used as gates of transistors. Alternatively in some examples, the first gate electrode 120 disposed on one side of the first source/drain pattern 150 may be used as a gate of the transistor, but the first gate electrode 120 disposed on the other side of the first source/drain pattern 150 may be a dummy gate electrode.

The first gate insulating film 130 may extend along the upper surface of the field insulating film 105 and the upper surface BP1_US of the first lower pattern. The first gate insulating film 130 may surround the plurality of first sheet patterns NS1. The first gate insulating film 130 may be disposed along a circumference of the first sheet pattern NS1. The first gate electrode 120 is disposed on the first gate insulating film 130. The first gate insulating film 130 is disposed between the first gate electrode 120 and the first sheet pattern NS1. A portion of the first gate insulating layer 130 may be disposed between adjacent ones of the first sheet patterns NS1 adjacent to each other in the third direction D3 and between the first lower pattern BP1 and the first sheet pattern NS1.

The first gate insulating film 130 may include one or more of silicon oxide, silicon-germanium oxide, germanium oxide, silicon oxynitride, silicon nitride, or a high-k material having a higher dielectric constant than that of silicon oxide. The high dielectric constant (high-k) material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although it is illustrated that the first gate insulating film 130 is embodied as a single film, this is intended for convenience of explanation, and example embodiments are not limited thereto. In some example embodiments, the first gate insulating film 130 may include a plurality of films. The first gate insulating film 130 may include an interfacial layer disposed between the first sheet pattern NS1 and the first gate electrode 120, and a high dielectric constant insulating film.

The semiconductor device according to some example embodiments may include an NC (negative capacitance) FET using a negative capacitor. For example, the first gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, example embodiments are not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness having the ferroelectric properties. Although the thickness of the ferroelectric material film may be, for example, in a range of about 0.5 to about 10 nm, example embodiments are not limited thereto. Because a critical thickness exhibiting the ferroelectric properties may be vary based on a type of the ferroelectric material, the thickness of the ferroelectric material film may vary depending on the type of the ferroelectric material.

In some examples, the first gate insulating film 130 may include one ferroelectric material film. Alternatively in some examples, the first gate insulating film 130 may include a plurality of ferroelectric material films spaced apart from each other. The first gate insulating film 130 may have a multilayer structure in which a plurality of ferroelectric material films and a plurality of paraelectric material films are alternately stacked on top of each other.

The first gate spacer 140 may be disposed on a sidewall of the first gate electrode 120. The first gate spacer 140 may not be disposed between the first lower pattern BP1 and the first sheet pattern NS1 and between adjacent ones of the first sheet patterns NS1 adjacent to each other in the third direction D3.

The first gate spacer 140 may include an inner sidewall 140_ISW, a connection sidewall 140_CSW, and an outer sidewall 140_OSW. The inner sidewall 140_ISW of the first gate spacer faces the first gate electrode 120 extending in the second direction D2. The inner sidewall 140_ISW of the first gate spacer may extend in the second direction D2. The inner sidewall 140_ISW of the first gate spacer may be opposite to the outer sidewall 140_OSW of the first gate spacer facing the first interlayer insulating film 190. The connection sidewall 140_CSW of the first gate spacer connects the inner sidewall 140_ISW2 of the first gate spacer and the outer sidewall 140_OSW of the first gate spacer to each other. The connection sidewall 140_CSW of the first gate spacer may extend in the first direction D1.

The first gate insulating film 130 may extend along the inner sidewall 140_ISW of the first gate spacer. The first gate insulating film 130 may contact the inner sidewall 140_ISW of the first gate spacer.

The first gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations thereof. Example embodiments are not limited thereto. Although it is illustrated that the first gate spacer 140 is embodied as a single film, this is intended for convenience of explanation and example embodiments are not limited thereto.

The first gate capping pattern 145 may be disposed on the first gate electrode 120 and the first gate spacer 140. An upper surface of the first gate capping pattern 145 may be coplanar with an upper surface of the first interlayer insulating film 190. Unlike what is shown, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity with respect to (e.g. may etch slower or faster than) the first interlayer insulating film 190.

The first source/drain pattern 150 may be disposed on the first active pattern AP1. The first source/drain pattern 150 may be disposed on the first lower pattern BP1. The first source/drain pattern 150 is connected to the first sheet pattern NS1. The first source/drain pattern 150 contacts the first sheet pattern NS1.

The first source/drain pattern 150 may be disposed on a side face of the first gate structure GS1. The first source/drain pattern 150 may be disposed between the first gate structures GS1 adjacent to each other in the first direction D1. For example, the first source/drain pattern 150 may be disposed on each of both sides of the first gate structure GS1. Unlike what is shown, the first source/drain pattern 150 may be disposed on one side of the first gate structure GS1, and may not be disposed on the other side of the first gate structure GS1.

The first source/drain pattern 150 may be included in a source/drain of a transistor using the first sheet pattern NS1 as a channel area thereof.

The first source/drain pattern 150 may be disposed in a first source/drain recess 150R. The first source/drain pattern 150 may fill the first source/drain recess 150R.

The first source/drain recess 150R extends in the third direction D3. The first source/drain recess 150R may be defined between adjacent ones of the first gate structure GS1 adjacent to each other in the first direction D1.

A bottom surface of the first source/drain recess 150R is defined by the first lower pattern BP1. A sidewall of the first source/drain recess 150R may be defined by the first sheet pattern NS1 and the inner gate structure INT1_GS1, INT2_GS1, INT3_GS1, and INT4_GS1. The inner gate structure INT1_GS1, INT2_GS1, INT3_GS1, and INT4_GS1 may define a portion of the sidewall of the first source/drain recess 150R. In FIG. 4 to FIG. 6, the first source/drain recess 150R contains the connection sidewall 140_CSW of the first gate spacer.

Each of the inner gate structures INT1_GS1, INT2_GS1, INT3_GS1, and INT4_GS1 may include an upper surface facing the bottom surface NS1_BS of a corresponding first sheet pattern. Each of the inner gate structures INT1_GS1, INT2_GS1, INT3_GS1, and INT4_GS1 may include a bottom surface facing the upper surface NS1_US of a corresponding first sheet pattern or the upper surface BP1_US of the first lower pattern. Each of the inner gate structures INT1_GS1, INT2_GS1, INT3_GS1, and INT4_GS1 may include a side wall connecting the upper surface of each of the inner gate structures INT1_GS1, INT2_GS1, INT3_GS1, and INT4_GS1 and the bottom surface of each of the inner gate structures INT1_GS1, INT2_GS1, INT3_GS1, and INT4_GS1 to each other. The sidewall of each of the inner gate structures INT1_GS1, INT2_GS1, INT3_GS1, and INT4_GS1 may define a portion of the sidewall of the first source/drain recess 150R.

In an area between the lowest first sheet pattern NS1 and the first lower pattern BP1, a boundary between the first gate insulating film 130 and the first lower pattern BP1 may be the upper surface BP1_US of the first lower pattern. The upper surface BP1_US of the first lower pattern may be a boundary between the fourth inner gate structure INT4_GS1 and the first lower pattern BP1. A vertical level of a bottom surface of the first source/drain recess 150R is lower than that of the upper surface BP1_US of the first lower pattern.

In FIG. 2, the sidewall of the first source/drain recess 150R may have a wavy shape. The first source/drain recess 150R may include a plurality of width extension areas 150R_ER. Each of the width extension areas 150R_ER of the first source/drain recess 150R may be defined above the upper surface BP1_US of the first lower pattern.

The width extension area 150R_ER of the first source/drain recess 150R may be defined between adjacent ones of the first sheet patterns NS1 adjacent to each other in the third direction D3. The width extension area 150R_ER of the first source/drain recess 150R may be defined between the first lower pattern BP1 and the first sheet pattern NS1. The width extension area 150R_ER of the first source/drain recess 150R may extend into a space between adjacent ones of the first sheet patterns NS1 adjacent to each other in the third direction D3. The width extension area 150R_ER of the first source/drain recess 150R may be defined between adjacent ones of the inner gate structures INT1_GS1, INT2_GS1, INT3_GS1, and INT4_GS1 adjacent to each other in the first direction D1.

Each of the width extension areas 150R_ER may include a portion having a dimension in the first direction D1 increasing as each of the width extension areas 150R_ER extends away from the upper surface BP1_US of the first lower pattern, and a portion having a dimension in the first direction D1 decreasing as each of the width extension areas 150R_ER extends away from the upper surface BP1_US of the first lower pattern. For example, as each of the width extension areas 150R_ER extends away from the upper surface BP1_US of the first lower pattern, a dimension in the first direction D1 of the width extension area 150R_ER may increase and then decrease.

In the semiconductor device according to some example embodiments, a point at which a width of the width extension area 150R_ER of the first source/drain recess 150R is maximum (e.g. locally or globally maximum) may be positioned between the first sheet pattern NS1 and the first lower pattern BP1, or between adjacent ones of the first sheet pattern NS1 adjacent to each other in the third direction D3.

The first source/drain pattern 150 may contact the first sheet pattern NS1 and the first lower pattern BP1. A portion of the first source/drain pattern 150 may contact the connection sidewall 140_CSW of the first gate spacer. The first gate insulating film 130 of each of the inner gate structures INT1_GS1, INT2_GS1, INT3_GS1, and INT4_GS1 may contact the first source/drain pattern 150.

The first source/drain pattern 150 may include a semiconductor liner film 151 and a semiconductor filling film 153.

The semiconductor liner film 151 may extend continuously along the first source/drain recess 150R. The semiconductor liner film 151 may extend along the sidewall of the first source/drain recess 150R and the bottom surface of the first source/drain recess 150R. The semiconductor liner film 151 formed along the first source/drain recess 150R defined by the first sheet pattern NS1 is connected to (e.g., directly connected to) the semiconductor liner film 151 formed along the first source/drain recess 150R defined by the inner gate structures INT1_GS1, INT2_GS1, INT3_GS1, and INT4_GS1.

The semiconductor liner film 151 is in contact with the first sheet pattern NS1, the first lower pattern BP1 and inner gate structures INT1_GS1, INT2_GS1, INT3_GS1, and INT4_GS1. The semiconductor liner film 151 is in contact with the first gate insulating film 130 of each of the inner gate structures INT1_GS1, INT2_GS1, INT3_GS1, and INT4_GS1.

The semiconductor liner film 151 may include an outer surface 151_OSW and an inner surface 151_ISW. The outer surface 151_OSW of the semiconductor liner film is in contact with the first gate insulating film 130, the first sheet pattern NS1, and the first lower pattern BP1. The outer surface 151_OSW of the semiconductor liner film is in contact with the sidewall of each of the inner gate structures INT1_GS1, INT2_GS1, INT3_GS1, and INT4_GS1. The outer surface 151_OSW of the semiconductor liner film may conform to a profile of the first source/drain recess 150R.

The inner surface 151_ISW of the semiconductor liner film may be opposite to the outer surface 151_OSW of the semiconductor liner film. The inner surface 151_ISW of the semiconductor liner film faces the semiconductor filling film 153.

A portion of the semiconductor liner film 151 protrudes upwardly in the third direction D3 beyond the upper surface AP1_US of the first uppermost sheet pattern. In the cross-sectional view as shown in FIG. 2, the semiconductor liner film 151 may cover a portion of the outer sidewall 140_OSW of the first gate spacer. The semiconductor liner film 151 may extend along a portion of the outer sidewall 140_OSW of the first gate spacer.

A height H1 from the upper surface BP1_US of the first lower pattern to the upper surface AP1_US of the first uppermost sheet pattern is smaller than a height H2 from the upper surface BP1_US of the first lower pattern to a top of the semiconductor liner film 151.

The semiconductor liner film 151 may cover a portion of the connection sidewall 140_CSW of the first gate spacer. In the plan view as shown in each of FIG. 5 and FIG. 6, the semiconductor liner film 151 may protrude in the first direction D1 beyond the outer sidewall 140_OSW of the first gate spacer. The inner surface 151_ISW of the semiconductor liner film may protrude in the first direction D1 beyond the outer sidewall 140_OSW of the first gate spacer.

In FIG. 5, the semiconductor liner film 151 may include a first horizontal portion 151_HP1 and a second horizontal portion 151_HP2. The second horizontal portion 151_HP2 of the semiconductor liner film is disposed between the first horizontal portion 151_HP1 of the semiconductor liner film and the semiconductor filling film 153. For example, the first horizontal portion 151_HP1 of the semiconductor liner film is disposed between the second horizontal portion 151_HP2 of the semiconductor liner film and the first sheet pattern NS1.

The first horizontal portion 151_HP1 of the semiconductor liner film is in contact with the first sheet pattern NS1. The first horizontal portion 151_HP1 of the semiconductor liner film may cover a portion of the connection sidewall 140_CSW of the first gate spacer. A portion of the connection sidewall 140_CSW of the first gate spacer may be in contact with the first horizontal portion 151_HP1 of the semiconductor liner film.

The second horizontal portion 151_HP2 of the semiconductor liner film may protrude in the first direction D1 beyond the outer sidewall 140_OSW of the first gate spacer. The second horizontal portion 151_HP2 of the semiconductor liner film may cover at least a portion of the outer sidewall 140_OSW of the first gate spacer. A portion of the second horizontal portion 151_HP2 of the semiconductor liner film may protrude in the second direction D2 beyond the connection sidewall 140_CSW of the first gate spacer.

The first horizontal portion 151_HP1 of the semiconductor liner film does not cover the outer sidewall 140_OSW of the first gate spacer. Based on the outer sidewall 140_OSW of the first gate spacer, the first horizontal portion 151_HP1 of the semiconductor liner film and the second horizontal portion 151_HP2 of the semiconductor liner film may be distinguished from each other. A width W21 in the second direction D2 of the first horizontal portion 151_HP1 of the semiconductor liner film is smaller than a width W22 in the second direction D2 of the second horizontal portion 151_HP2 of the semiconductor liner film.

In FIG. 6, the semiconductor liner film 151 may not cover the outer sidewall 140_OSW of the first gate spacer. The semiconductor liner film 151 may not protrude in the second direction D2 beyond the connection sidewall 140_CSW of the first gate spacer.

Hereinafter, a plan view in a portion in contact with the first sheet pattern NS1 is described using FIG. 5.

The semiconductor liner film 151 may define a liner recess 151R. For example, the liner recess 151R may be defined by the inner surface 151_ISW of the semiconductor liner film. A sidewall of the liner recess 151R may have a wavy shape. In FIG. 2 and FIG. 7, the sidewall of the liner recess 151R may be a portion of the liner recess 151R positioned above a first reference line F1 of FIG. 7. For example, a position of the first reference line F1 of FIG. 7 may be a position corresponding to a position of the upper surface BP1_US of the first lower pattern of FIG. 2. A position of a second reference line F2 in FIG. 7 may be a position corresponding to a position of the upper surface AP1_US of the first active pattern in FIG. 2.

The liner recess 151R may include a plurality of width extension areas 151R_ER. Each of the width extension areas 151R_ER of the liner recess may be defined above the upper surface BP1_US of the first lower pattern. In the semiconductor device according to various example embodiments, each of the width extension areas 151R_ER of the liner recess may be defined at a position corresponding to a position of each of the width extension areas 150R_ER of the first source/drain recess.

The width extension area 151R_ER of the liner recess may be defined between the first sheet patterns NS1 adjacent to each other in the third direction D3. The width extension area 151R_ER of the liner recess may be defined between the first lower pattern BP1 and the first sheet pattern NS1. The width extension area 151R_ER of the liner recess may be defined between adjacent ones of the inner gate structures INT1_GS1, INT2_GS1, INT3_GS1, and INT4_GS1 adjacent to each other in the first direction D1.

Each of the width extension areas 151R_ER of the liner recess may include a portion whose width in the first direction D1 increases as the portion moves away from the upper surface BP1_US of the first lower pattern, and a portion whose a width in the first direction D1 decreases as the portion moves away from the upper surface BP1_US of the first lower pattern. For example, as each of the width extension areas 151R_ER of the liner recess moves away from the upper surface BP1_US of the first lower pattern, a width of each of the width extension areas 151R_ER of the liner recess may increase and then decrease.

In each of the width extension areas 151R_ER of the liner recess, a point at which the width of each of the width extension areas 151R_ER of the liner recess is maximum (e.g., locally or globally maximum or near maximum) is positioned between the first sheet pattern NS1 and the first lower pattern BP1, or between the first sheet patterns NS1 adjacent to each other in the third direction D3.

For example, in FIG. 8, the semiconductor liner film 151 may contact an entirety of a sidewall of the second inner gate structure INT2_GS1. Although not shown, the semiconductor liner film 151 may contact an entirety of a sidewall of the first inner gate structure INT1_GS1, an entirety of a sidewall of the third inner gate structure INT3_GS1, and an entirety of a sidewall of the fourth inner gate structure INT4_GS1.

In FIG. 9, a semiconductor residue pattern SP_R may be disposed between the second inner gate structure INT2_GS1 and the semiconductor liner film 151. The semiconductor residue pattern SP_R may contact the first sheet pattern NS1. The semiconductor residue pattern SP_R may contact the outer surface 151_OSW of the semiconductor liner film and the sidewall of the second inner gate structure INT2_GS1.

The semiconductor residue pattern SP_R may include, for example, silicon-germanium. When the semiconductor liner film 151 includes silicon-germanium, a fraction of germanium (or a concentration of germanium) in the semiconductor residue pattern SP_R is larger than a fraction of germanium in the semiconductor liner film 151. The semiconductor residue pattern SP_R may be a portion remaining after a sacrificial pattern (SC_L in FIG. 37) has been removed. In some example embodiments, the semiconductor residue pattern SP_R may be made of or include silicon germanium having a stochiometric formula of $Si_xGe_{1-x}$ while semiconductor liner film 151 may be made of or include silicon germanium having a stochiometric formula of $Si_yGe_{1-y}$. In some example embodiments, x may be greater than y.

Although not shown, the semiconductor residue pattern SP_R may be disposed between the first inner gate structure INT1_GS1 and semiconductor liner film 151, between the third inner gate structure INT3_GS1 and the semiconductor liner film 151, or between the fourth inner gate structure INT4_GS1 and the semiconductor liner film 151.

In FIG. 10, an inner gate air gap INT_AG may be disposed between the second inner gate structure INT2_GS1 and the semiconductor liner film 151. The inner gate air gap INT_AG may be disposed between the semiconductor liner film 151 and the first gate insulating film 130 of the second inner gate structure INT2_GS1. The inner gate air gap INT_AG may be defined between the semiconductor liner film 151, the first sheet pattern NS1, and the second inner gate structure INT2_GS1. In some example embodiments, the inner air gap INT_AG may be made of or include air such as clean, dry air (CDA). In some example embodiments, the inner air gap INT_AG may be in vacuum; however, example embodiments are not limited thereto.

Although not shown, when the first gate insulating film 130 includes an interfacial layer and a high dielectric constant (high-k) insulating film, the interfacial layer may be formed on a portion of the semiconductor liner film 151 in contact with the inner gate air gap INT_AG.

Further, although not shown, the inner gate air gap INT_AG may be disposed between the first inner gate structure INT1_GS1 and the semiconductor liner film 151, the third inner gate structure INT3_GS1 and the semiconductor liner film 151, or the fourth inner gate structure INT4_GS1 and the semiconductor liner film 151.

The semiconductor filling film 153 is disposed in the liner recess 151R. The semiconductor filling film 153 may be disposed on the semiconductor liner film 151. The semiconductor filling film 153 may fill the liner recess 151R.

The semiconductor filling film 153 may be in contact with the semiconductor liner film 151. The semiconductor filling film 153 may contact the inner sur face 151_ISW of the semiconductor liner film. In the semiconductor device according to some example embodiments, an entirety of the inner surface 151_ISW of the semiconductor liner film may contact the semiconductor filling film 153.

The semiconductor filling film 153 may include at least one bulge portion. In the bulge portion of the semiconductor filling film 153, a width in the first direction D1 of the semiconductor filling film 153 may increase and decrease as the semiconductor filling film 153 extends away from the first lower pattern BP1.

Each of the semiconductor liner film 151 and the semiconductor filling film 153 may include silicon-germanium. Each of the semiconductor liner film 151 and the semiconductor filling film 153 may include a silicon-germanium film. Each of the semiconductor liner film 151 and the semiconductor filling film 153 may be an epitaxial semiconductor film, e.g. may be formed by an epitaxial process. There may or may not be an interface between the substrate 100 and the semiconductor liner film 151; example embodiments are not limited thereto.

Each of the semiconductor liner film 151 and the semiconductor filling film 153 may contain doped p-type impurities. For example, the p-type impurity may include, but is not limited to, at least one of boron (B) and/or gallium (Ga) at the same, or different concentrations.

In FIG. 11, a fraction of germanium in the semiconductor liner film 151 is smaller than a fraction of germanium in the semiconductor filling film 153. For example, in some example embodiments, the semiconductor liner film 151 may be made of or include silicon germanium having a stoichiometric formula of $Si_xGe_{1-x}$ while semiconductor filling film 153 may be made of or include silicon germanium having a stoichiometric formula of $Si_yGe_{1-y}$. In some example embodiments, x may be greater than y.

Using FIG. 2 and FIG. 7, a shape of the semiconductor liner film 151 is further described.

The inner surface 151_ISW of the semiconductor liner film may include a plurality of first inner convexly-curved face areas 151_ICVR and a plurality of first inner concavely-curved face areas 151_ICCR.

The plurality of first inner concavely-curved face areas 151_ICCR may be respectively disposed in the width extension areas 151R_ER of the liner recess. Each of the plurality of first inner concavely-curved face areas 151_ICCR may be positioned at a point overlapping with the first gate electrode 120 of each of the inner gate structures INT1_GS1, INT2_GS1, INT3_GS1, and INT4_GS1 in the first direction D1.

Each of the plurality of first inner convexly-curved face areas 151_ICVR may be disposed between the width extension areas 151R_ER of the liner recess adjacent to each other in the third direction D3. For example, each of the plurality of first inner convexly-curved face areas 151_ICVR may be positioned at a point overlapping with the first sheet pattern NS1 in the first direction D1.

The first inner convexly-curved face area 151_ICVR may be positioned between the first inner concavely-curved face areas 151_ICCR adjacent to each other in the third direction D3. The first inner concavely-curved face area 151_ICCR may be positioned between the first inner convexly-curved face areas 151_ICVR adjacent to each other in the third direction D3.

The plurality of first inner concavely-curved face areas 151_ICVR and the plurality of first inner concavely-curved face areas 151_ICCR may be disposed above the first reference line F1. The plurality of first inner concavely-curved face areas 151_ICVR and the plurality of first inner concavely-curved face areas 151_ICCR may be disposed above the second reference line F2.

The outer surface 151_OSW of the semiconductor liner film may include a plurality of first outer convexly-curved face areas 151_OCVR and a plurality of first outer concavely-curved face areas 151_OCCR.

For example, the first outer convexly-curved face area 151_OCVR may be disposed at a position corresponding to that of the first inner concavely-curved face area 151_ICCR. The first outer concavely-curved face area 151_OCCR may be disposed at a position corresponding to that of the first inner convexly-curved face area 151_ICVR.

The first outer convexly-curved face area 151_OCVR may contact the first gate insulating film 130 of each of the inner gate structures INT1_GS1, INT2_GS1, INT3_GS1, and INT4_GS1. The first outer concavely-curved face area 151_OCCR may contact the first sheet pattern NS1. The first outer concavely-curved face area 151_OCCR may contact, for example, a side end of the first sheet pattern NS1. In the cross-sectional view of FIG. 2, the first sheet pattern NS1 may include two side ends spaced apart from each other in the first direction D1.

The plurality of first outer concavely-curved face areas 151_OCVR and the plurality of first outer concavely-curved face areas 151_OCCR may be disposed above the first reference line F1. The plurality of first outer concavely-curved face areas 151_OCVR and the plurality of first outer concavely-curved face areas 151_OCCR may be disposed below the second reference line F2.

It is illustrated that the outer surface 151_OSW of the semiconductor liner film near the second reference line F2 has a stepped shape. However, example embodiments are not limited thereto.

The source/drain etch stop film 185 may extend along the outer sidewall 140_OSW of the first gate spacer and a profile of the first source/drain pattern 150. Although not shown, the source/drain etch stop film 185 may be disposed on the upper surface of the field insulating film 105.

The source/drain etch stop film 185 may include a material having an etch selectivity with respect to a material of the first interlayer insulating film 190 to be described later. The source/drain etch stop film 185 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or combinations thereof.

The first interlayer insulating film 190 may be disposed on the source/drain etch stop film 185. The first interlayer insulating film 190 may be disposed on the first source/drain pattern 150. The first interlayer insulating film 190 may not cover an upper surface of the first gate capping pattern 145. For example, an upper surface of the first interlayer insulating film 190 may be coplanar with the upper surface of the first gate capping pattern 145.

The first interlayer insulating film 190 may include, for example, at least one of silicon oxide, silicon nitride, silicon oxynitride, and a low dielectric constant (low-k) material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations of two more thereof. However, the spirit of example embodiments are not limited thereto.

The first source/drain contact 180 is disposed on the first source/drain pattern 150. The first source/drain contact 180 is connected to the first source/drain pattern 150. The first source/drain contact 180 passes through the first interlayer insulating film 190 and the source/drain etch stop film 185 so as to be connected to the first source/drain pattern 150.

A first contact silicide film 155 may be further disposed between the first source/drain contact 180 and the first source/drain pattern 150.

Although the first source/drain contact 180 is illustrated as being embodied as a single film, this is intended for convenience of explanation, and example embodiments are not limited thereto. The first source/drain contact 180 may include, for example, at least one of a metal, a metal alloy, a conductive metal nitride, a conductive metal carbide, a conductive metal oxide, a conductive metal carbonitride, or a two-dimensional (2D) material such as but not limited to one or more sheets of graphene and/or boron-nitride.

The first contact silicide film 155 may include a metal silicide material.

The second interlayer insulating film 191 is disposed on the first interlayer insulating film 190. The second interlayer insulating film 191 may include, for example, at least one of silicon oxide, silicon nitride, silicon oxynitride, or a low-k material.

The wiring structure 205 is disposed in the second interlayer insulating film 191. The wiring structure 205 may be connected to the first source/drain contact 180. The wiring structure 205 may include a wiring line 207 and a wiring via 206.

Although the wiring line 207 and the wiring via 206 are illustrated as being separated from each other, this is intended for convenience of explanation, and example embodiments are not limited thereto. For example, in some example embodiments, the wiring via 206 may be formed, and then the wiring line 207 may be formed. In some example embodiments, the wiring via 206 and the wiring line 207 may be formed simultaneously.

Although each of the wiring line 207 and the wiring via 206 is illustrated as being embodied as a single film, this is intended for convenience of explanation, and example embodiments are not limited thereto. Each of the wiring line 207 and the wiring via 206 each include, for example, at least one of a metal, a metal alloy, a conductive metal nitride, a conductive metal carbide, a conductive metal oxide, a conductive metal carbonitride, or a two-dimensional 2D material.

For example, an upper surface of a portion of the first source/drain contact 180 connected to the wiring structure 205 may be coplanar with an upper surface of a portion of the first source/drain contact 180 not connected to the wiring structure 205.

FIGS. 12 to 16 are diagrams for explaining a semiconductor device according to some example embodiments. For convenience of description, following descriptions are based on differences thereof from those as set forth above with reference to FIGS. 1 to 11.

Figure 12:
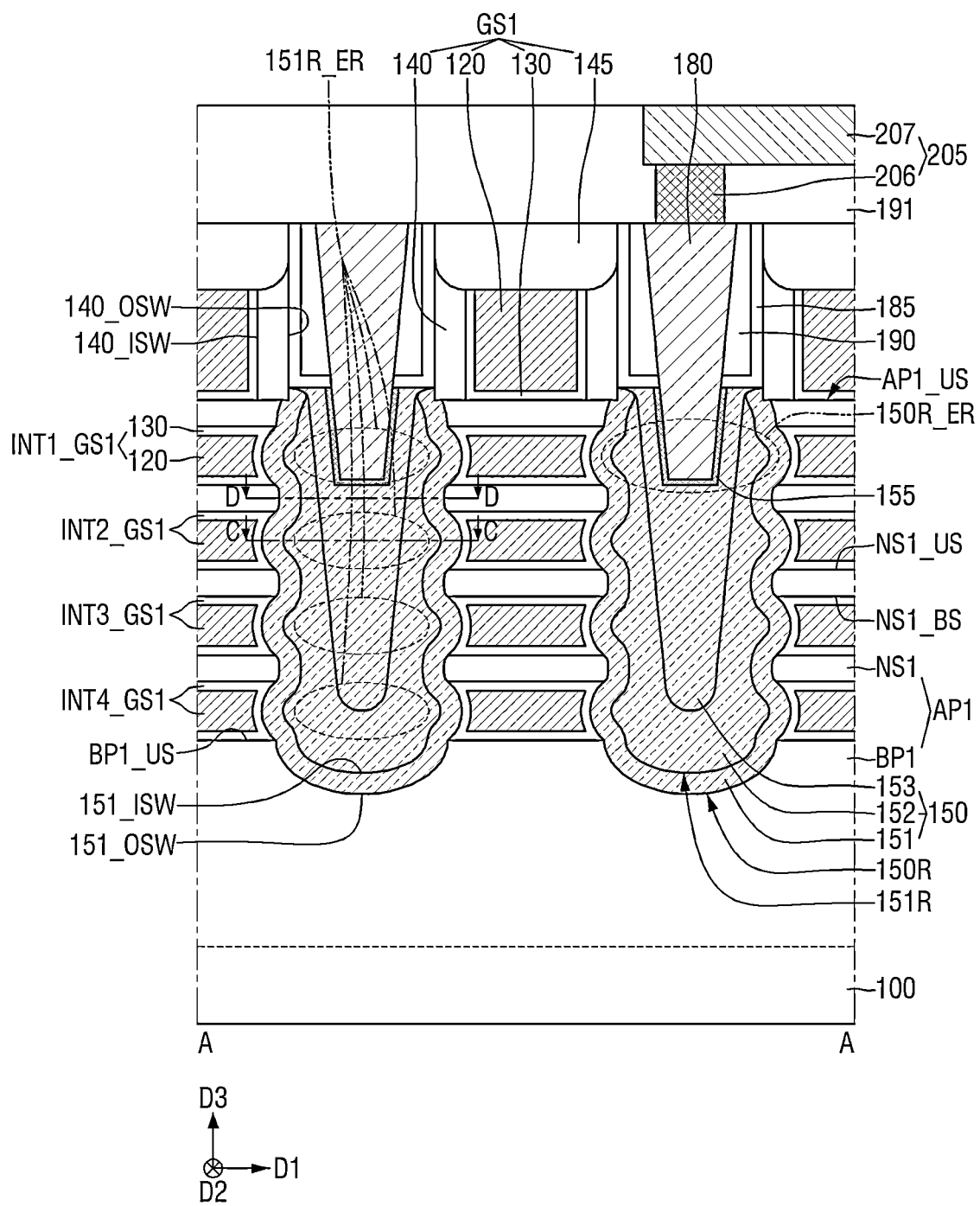
FIGS. 12 to 16 are diagrams for explaining a semiconductor device according to some example embodiments.
Figure 13:
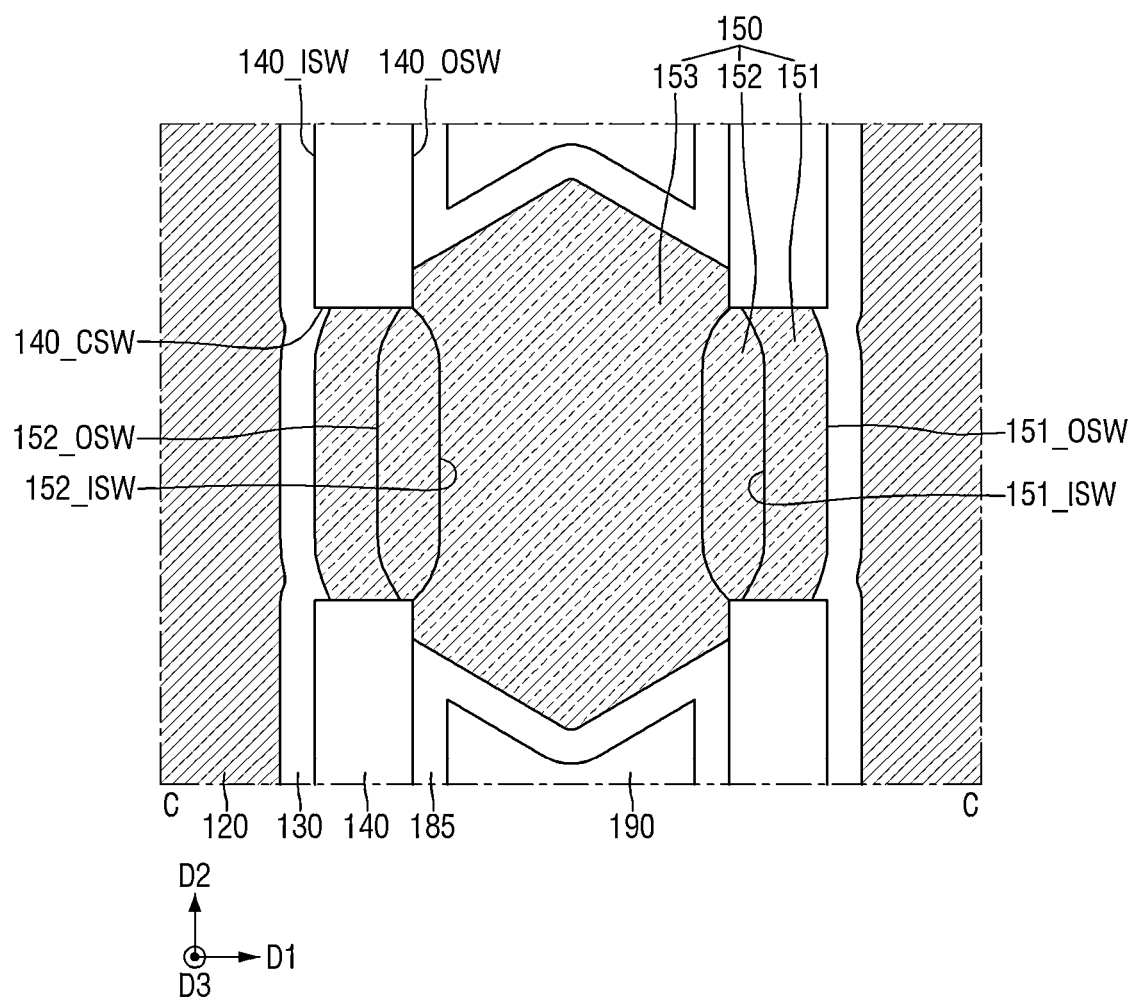
Figure 14:
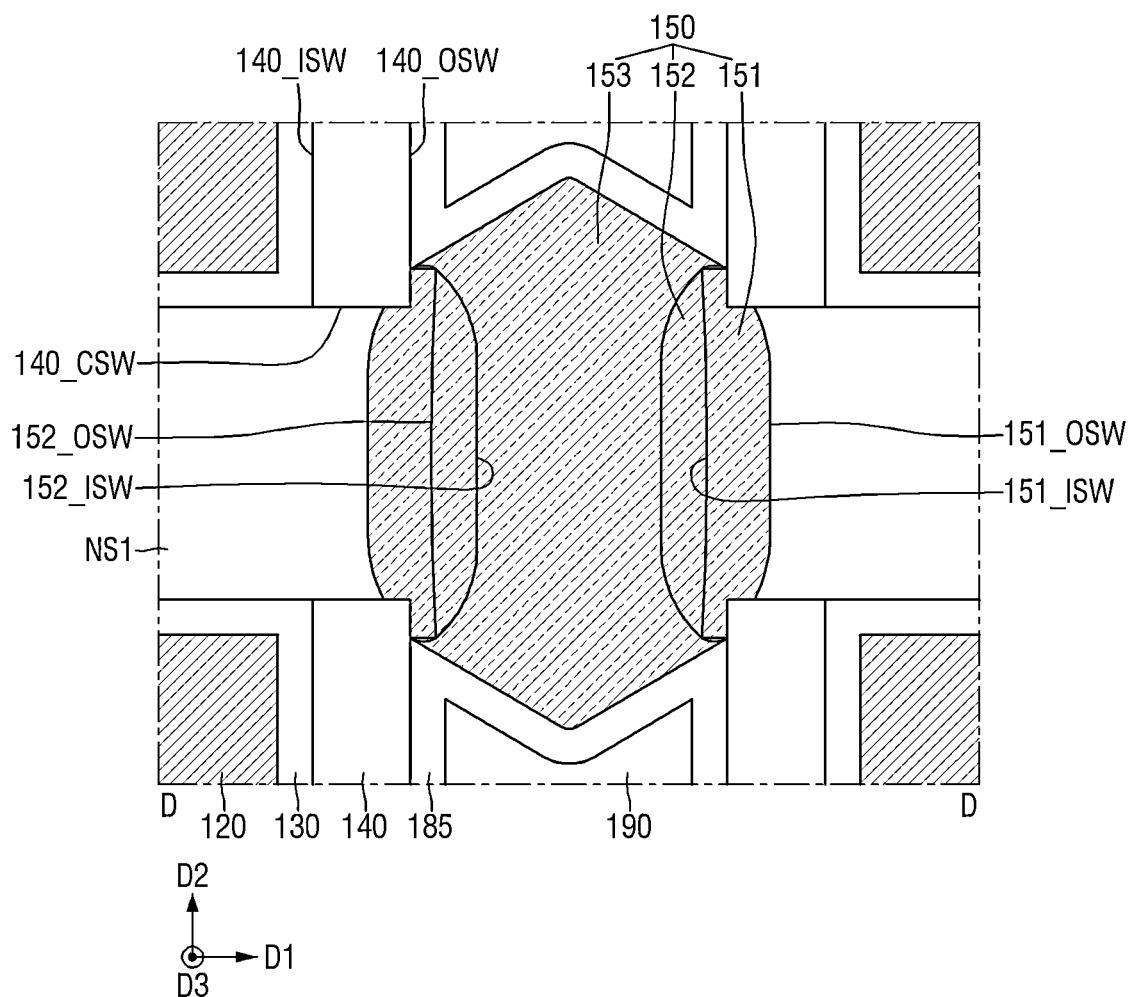
Figure 15:
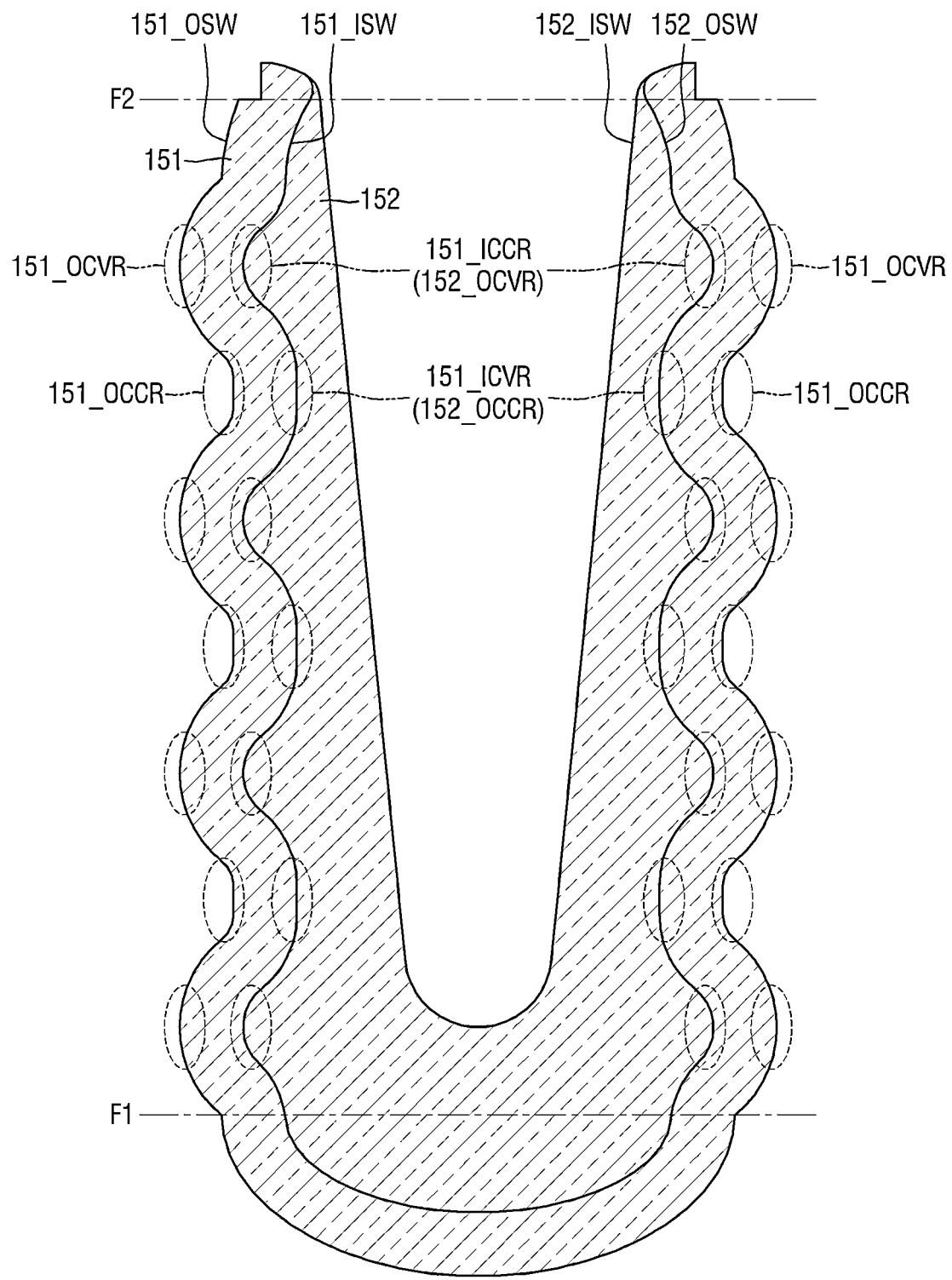
Figure 16:
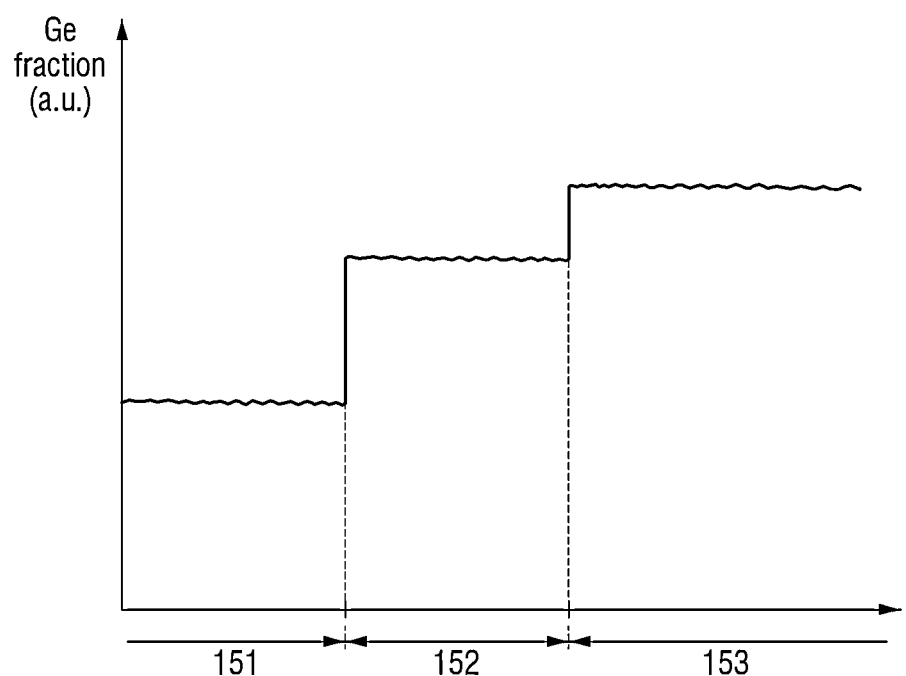

For reference, FIG. 13 and FIG. 14 are top views taken along lines C-C and D-D of FIG. 12, respectively. FIG. 15 is a diagram to explain the shape of each of a semiconductor liner film and a semiconductor inserted film of FIG. 12. FIG. 16 is a diagram for explaining a fraction of germanium in a first source/drain pattern of FIG. 12.

Referring to FIG. 12 to FIG. 16, in the semiconductor device according to some example embodiments, the first source/drain pattern 150 may further include the semiconductor inserted film 152 disposed between the semiconductor liner film 151 and the semiconductor filling film 153.

The semiconductor inserted film 152 and the semiconductor filling film 153 are disposed in the liner recess 151R. The semiconductor inserted film 152 and the semiconductor filling film 153 may fill the liner recess 151R.

The semiconductor inserted film 152 may be disposed on the semiconductor liner film 151. The semiconductor inserted film 152 may be formed along the liner recess 151R. The semiconductor inserted film 152 is in contact with the semiconductor liner film 151. The semiconductor inserted film 152 is in contact with the inner surface 151_ISW of the semiconductor liner film 151.

For example, the semiconductor inserted film 152 may be continuously formed or arranged along the inner surface 151_ISW of the semiconductor liner film. The semiconductor inserted film 152 may cover an entirety of the inner surface 151_ISW of the semiconductor liner film. The entirety of the inner surface 151_ISW of the semiconductor liner film may contact the semiconductor inserted film 152.

The semiconductor inserted film 152 may include an outer surface 152_OSW and an inner surface 152_ISW. The outer surface 152_OSW of the semiconductor inserted film is in contact with the semiconductor liner film 151. The outer surface 152_OSW of the semiconductor inserted film is in contact with the inner sur face 151_ISW of the semiconductor liner film.

The semiconductor liner film 151 may be formed along the outer surface 152_OSW of the semiconductor inserted film. For example, the semiconductor liner film 151 may contact an entirety of the outer surface 152_OSW of the semiconductor inserted film.

The outer surface 152_OSW of the semiconductor inserted film may face the first sheet pattern NS1 and the inner gate structures INT1_GS1, INT2_GS1, INT3_GS1, and INT4_GS1. Since the semiconductor liner film 151 is disposed between the semiconductor inserted film 152 and the first sheet pattern NS1, the outer surface 152_OSW of the semiconductor inserted film may not contact the first sheet pattern NS1. Further, the outer surface 152_OSW of the semiconductor inserted film may not come into contact with the inner gate structures INT1_GS1, INT2_GS1, INT3_GS1, and INT4_GS1.

The inner surface 152_ISW of the semiconductor inserted film may be opposite to the outer surface 152_OSW of the semiconductor inserted film. The inner surface 152_ISW of the semiconductor inserted film is a surface that faces the semiconductor filling film 153.

The inner surface 152_ISW of the semiconductor inserted film may define a filling film recess. A width in the first direction D1 of the filling film recess may increase as the filling film recess moves away from the first lower pattern BP1.

The semiconductor filling film 153 may fill the filling film recess defined by the inner surface 152_ISW of the semiconductor inserted film. The semiconductor filling film 153 may contact the semiconductor inserted film 152. The semiconductor filling film 153 may contact the inner surface 152_ISW of the semiconductor inserted film. For example, a width in the first direction D1 of the semiconductor filling film 153 may increase as the semiconductor filling film 153 extends away from the first lower pattern BP1.

The semiconductor inserted film 152 may include silicon-germanium. The semiconductor inserted film 152 may be an epitaxial semiconductor film, e.g. a semiconductor film formed with a heterogeneous and/or homogeneous epitaxial process.

The semiconductor inserted film 152 may contain doped p-type impurities. A fraction of germanium in the semiconductor inserted film 152 is larger than a fraction of germanium in the semiconductor liner film 151. The fraction of germanium in the semiconductor inserted film 152 is smaller than a fraction of germanium in the semiconductor filling film 153.

In FIG. 12 and FIG. 15, the outer surface 152_OSW of the semiconductor inserted film may include a plurality of second outer convexly-curved face areas 152_OCVR and a plurality of second outer concavely-curved face areas 152_OCCR.

For example, the second outer convexly-curved face area 152_OCVR may be disposed at a position corresponding to a position of the first inner concavely-curved face area 151_ICCR. The second outer convexly-curved face area 152_OCVR and the first inner concavely-curved face area 151_ICCR act as a boundary between the semiconductor liner film 151 and the semiconductor inserted film 152, such that the second outer convexly-curved face area 152_OCVR and the first inner concavely-curved face area 151_ICCR may positionally coincide with each other. For example, the second outer concavely-curved face area 152_OCCR may be disposed at a position corresponding to a position of the first inner convexly-curved face area 151_ICVR.

The plurality of second outer concavely-curved face areas 152_OCVR and the plurality of second outer concavely-curved face areas 152_OCCR may be disposed above the first reference line F1. The plurality of second outer concavely-curved face areas 152_OCVR and the plurality of second outer concavely-curved face area 152_OCCR may be disposed below the second reference line F2.

In the semiconductor device according to some example embodiments, the inner surface 152_ISW of the semiconductor inserted film does not include convexly-curved face areas and concavely-curved face areas alternately arranged with each other.

Figure 17:
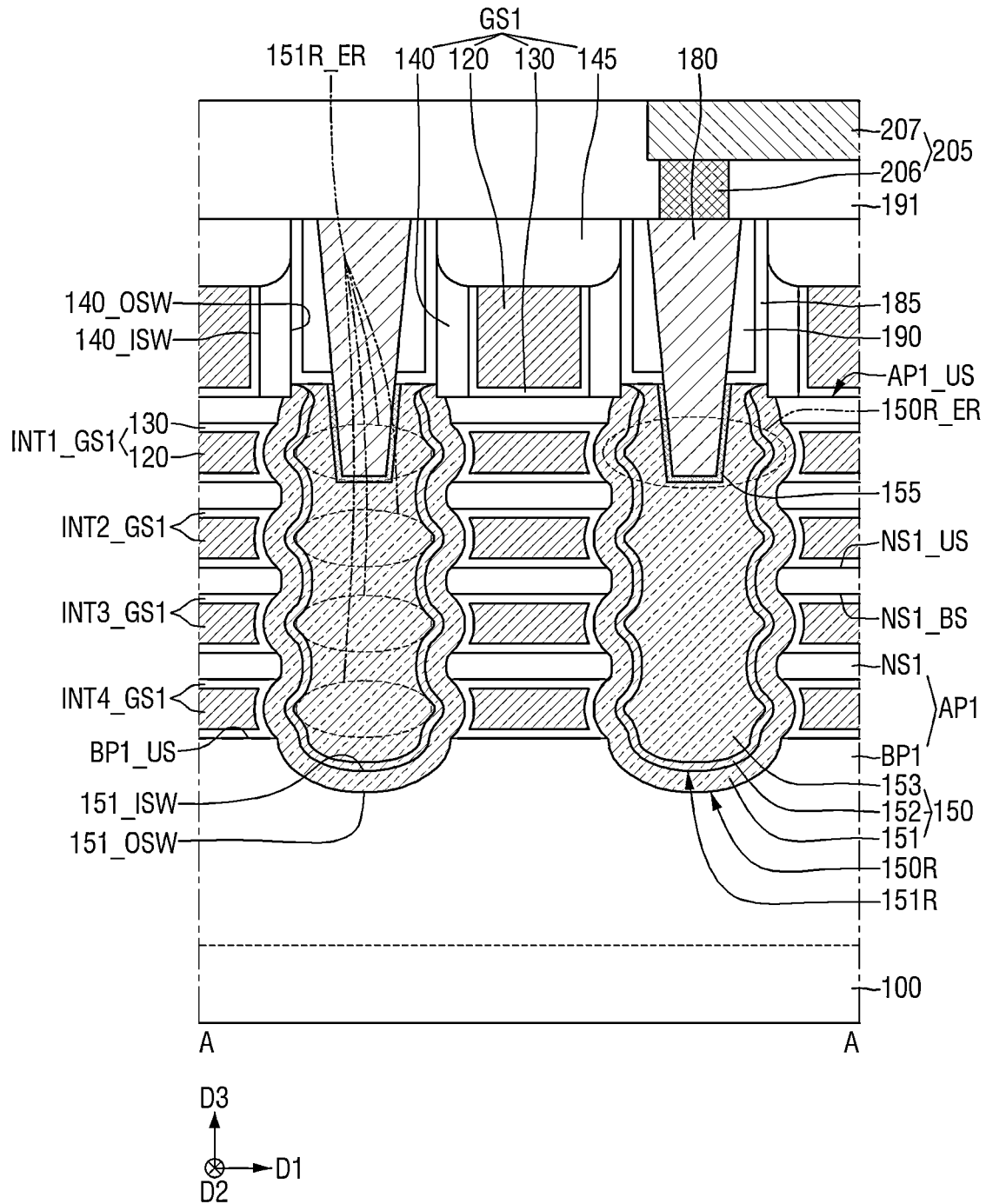
FIG. 17 and FIG. 18 are diagrams for explaining a semiconductor device according to some example embodiments.
Figure 18:
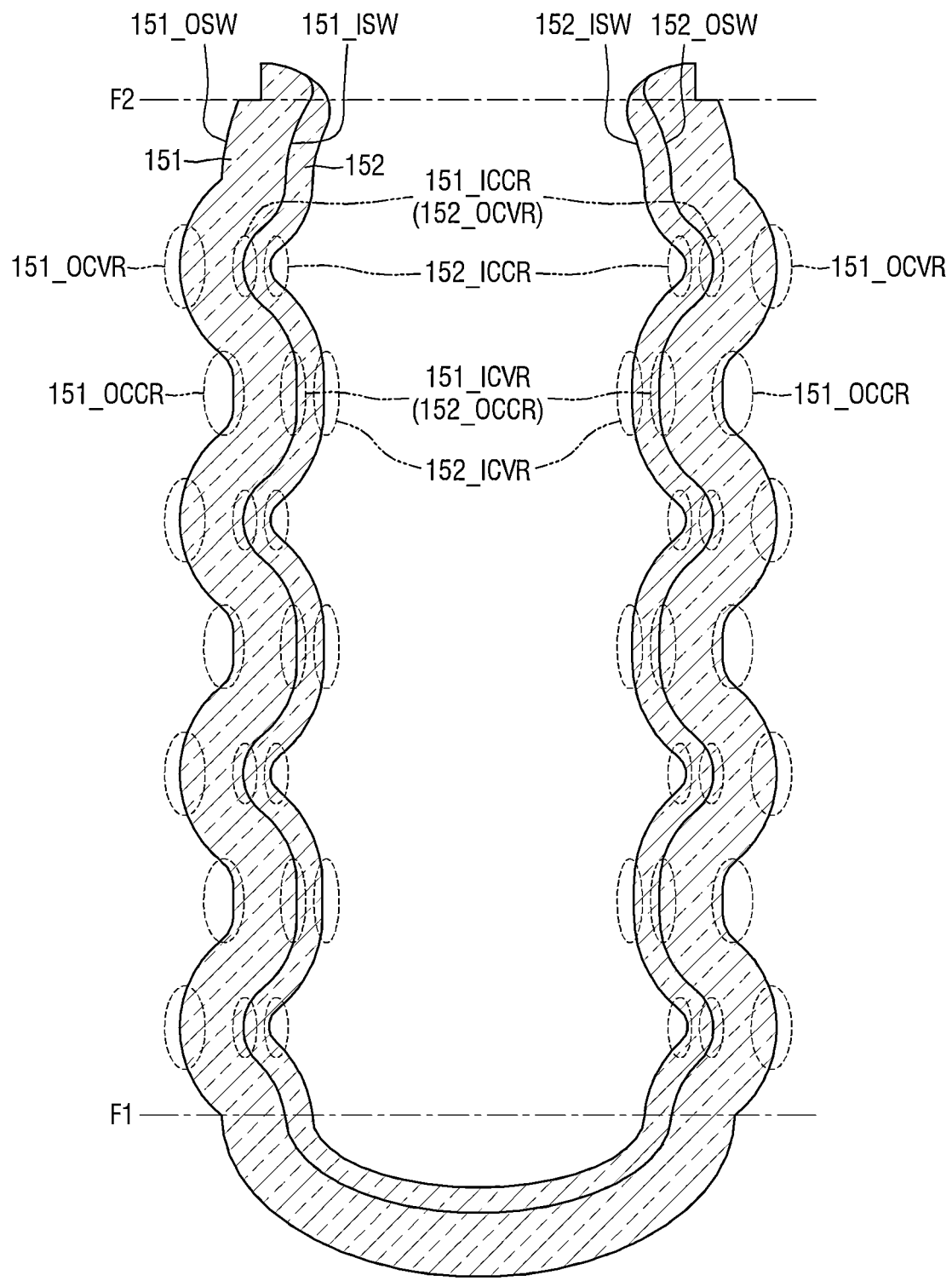

FIG. 17 and FIG. 18 are diagrams for explaining a semiconductor device according to some example embodiments. For convenience of explanation, following explanations are based on differences thereof from those as set forth above with reference to FIGS. 12 to 16.

For reference, FIG. 18 is a diagram to explain a shape of each of the semiconductor liner film and the semiconductor inserted film of FIG. 17.

Referring to FIG. 17 and FIG. 18, in the semiconductor device according to some example embodiments, the semiconductor inserted film 152 may be formed wavy along the inner surface 151_ISW of the semiconductor liner film.

The filling film recess defined by the inner surface 152_ISW of the semiconductor inserted film may include a plurality of width extension areas as the liner recess 151R may. The semiconductor filling film 153 may include at least one bulge portion.

The inner surface 152_ISW of the semiconductor inserted film may include a plurality of second inner convexly-curved face areas 152_ICVR and a plurality of second inner concavely-curved face areas 152_ICCR.

For example, the second outer concavely-curved face area 152_OCVR may be disposed at a position corresponding to a position of the second inner concavely-curved face area 152_ICCR. The second outer concavely-curved face area 152_OCCR may be disposed at a position corresponding to a position of the second inner convexly-curved face area 152_ICVR.

The plurality of second outer concavely-curved face areas 152_OCVR and the plurality of second outer concavely-curved face areas 152_OCCR may be disposed above the first reference line F1. The plurality of second outer concavely-curved face areas 152_OCVR and the plurality of second outer concavely-curved face areas 152_OCCR may be disposed below the second reference line F2.

Figure 19:
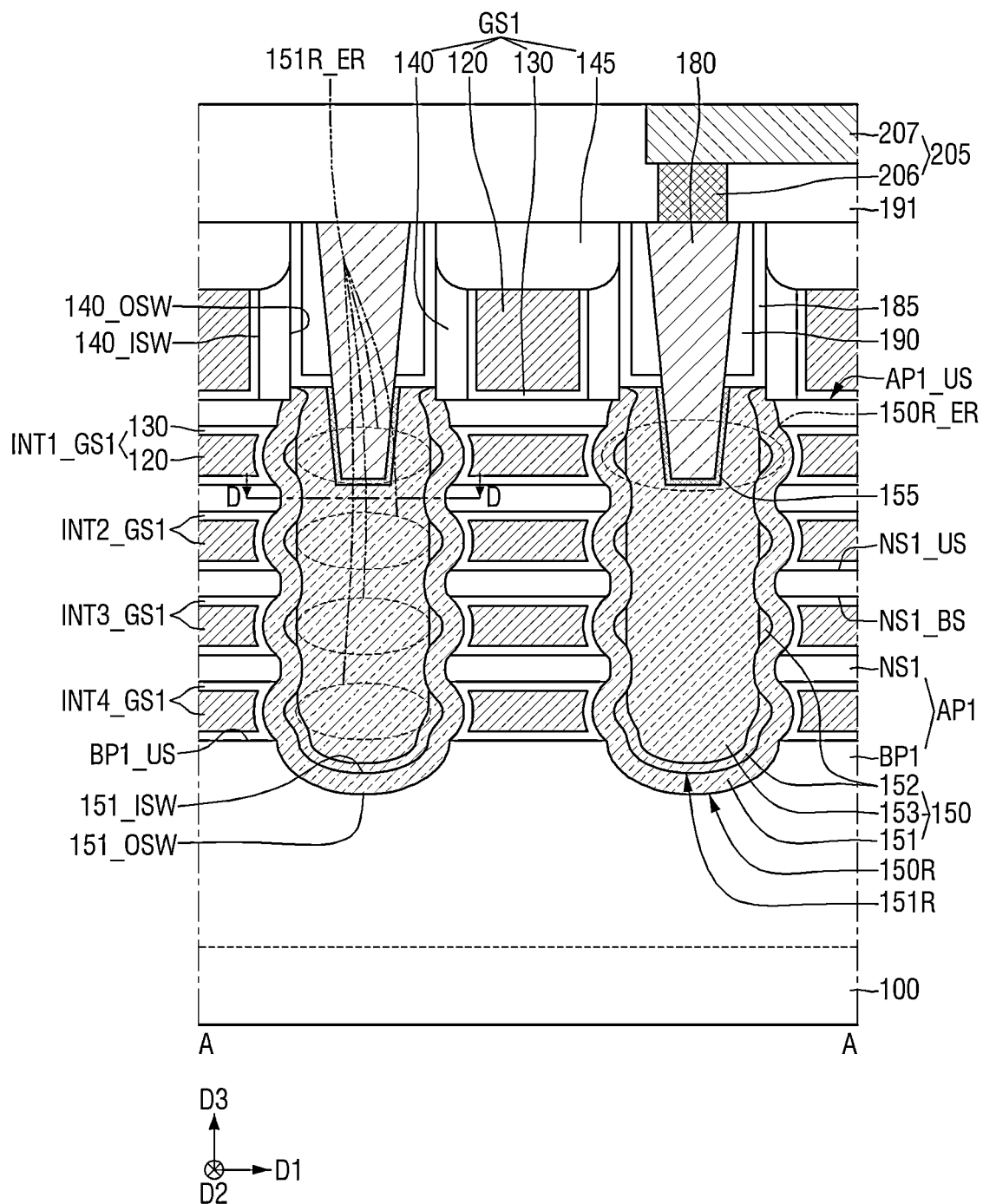
FIG. 19 and FIG. 20 are diagrams for explaining a semiconductor device according to some example embodiments.
Figure 20:
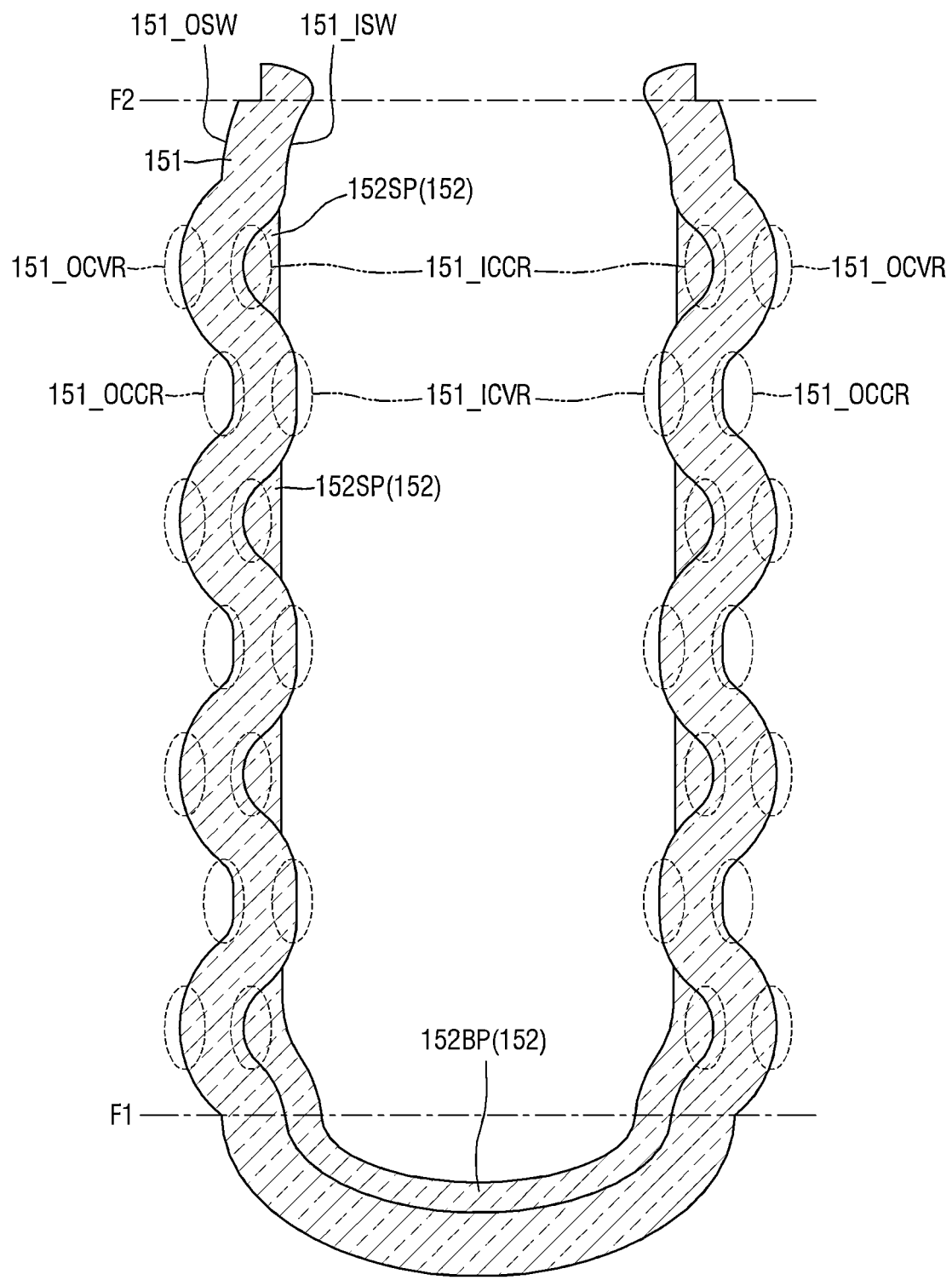

FIG. 19 and FIG. 20 are diagrams for explaining a semiconductor device according to some example embodiments. For convenience of description, following descriptions are based on differences thereof from those as set forth above with reference to FIGS. 12 to 16.

For reference, FIG. 20 is a diagram to explain a shape of each of the semiconductor liner film and the semiconductor inserted film of FIG. 19. A top view taken along D-D of FIG. 19 may be similar to that of each of FIG. 5 or FIG. 6.

Referring to FIG. 19 and FIG. 20, in the semiconductor device according to some example embodiments, the first source/drain pattern 150 may include a plurality of semiconductor inserted films 152 spaced apart from each other in the third direction D3.

Each semiconductor inserted film 152 is disposed between the semiconductor liner film 151 and the semiconductor filling film 153. Each semiconductor inserted film 152 may be in contact with the semiconductor liner film 151 and the semiconductor filling film 153.

The semiconductor inserted film 152 may include a first sub-semiconductor inserted film 152BP and a second sub-semiconductor inserted film 152SP. The first sub-semiconductor inserted film 152BP may be spaced apart from the second sub-semiconductor inserted film 152SP. The first sub-semiconductor inserted film 152BP may be spaced apart from the second sub-semiconductor inserted film 152SP in the third direction D3. The first sub-semiconductor inserted film 152BP does not come into contact with the second sub-semiconductor inserted film 152SP.

The first sub-semiconductor inserted film 152BP may be formed along a bottom surface of the liner recess 151R. The first sub-semiconductor inserted film 152BP may fill the lowermost first inner concavely-curved face area 151_ICCR.

The second sub-semiconductor inserted film 152SP may be disposed on a sidewall of the liner recess 151R. The second sub-semiconductor inserted film 152SP may be disposed in the first inner concavely-curved face area 151_ICCR so as to fill the first inner concavely-curved face area 151_ICCR.

Each of at least some of the plurality of semiconductor inserted films 152 may be disposed in the first inner concavely-curved face area 151_ICCR.

The second sub-semiconductor inserted film 152SP may not entirely cover the first inner convexly-curved face area 151_ICVR. As shown in FIG. 5 or FIG. 6, a portion of the semiconductor inserted film 152 in contact with the first sheet pattern NS1 may not cover the inner surface 151_ISW of the semiconductor liner. The portion of the semiconductor inserted film 152 in contact with the first sheet pattern NS1 may not be disposed between the semiconductor liner film 151 and the semiconductor filling film 153.

A portion of the semiconductor liner film 151 defining the first inner convexly-curved face area 151_ICVR is disposed between the second sub-semiconductor inserted films 152SP adjacent to each other in the third direction D3. The second sub-semiconductor inserted films 152SP adjacent to each other in the third direction D3 may not contact each other. A portion of the semiconductor liner film 151 defining the first inner convexly-curved face area 151_ICVR is disposed between the first sub-semiconductor inserted film 152BP and the second sub-semiconductor inserted film 152SP.

The semiconductor liner film 151 may contact the semiconductor filling film 153. A portion of the inner surface 151_ISW of the semiconductor liner film may contact the semiconductor inserted film 152, and the remainder of the inner surface 151_ISW of the semiconductor liner film may contact the semiconductor filling film 153.

Figure 21:
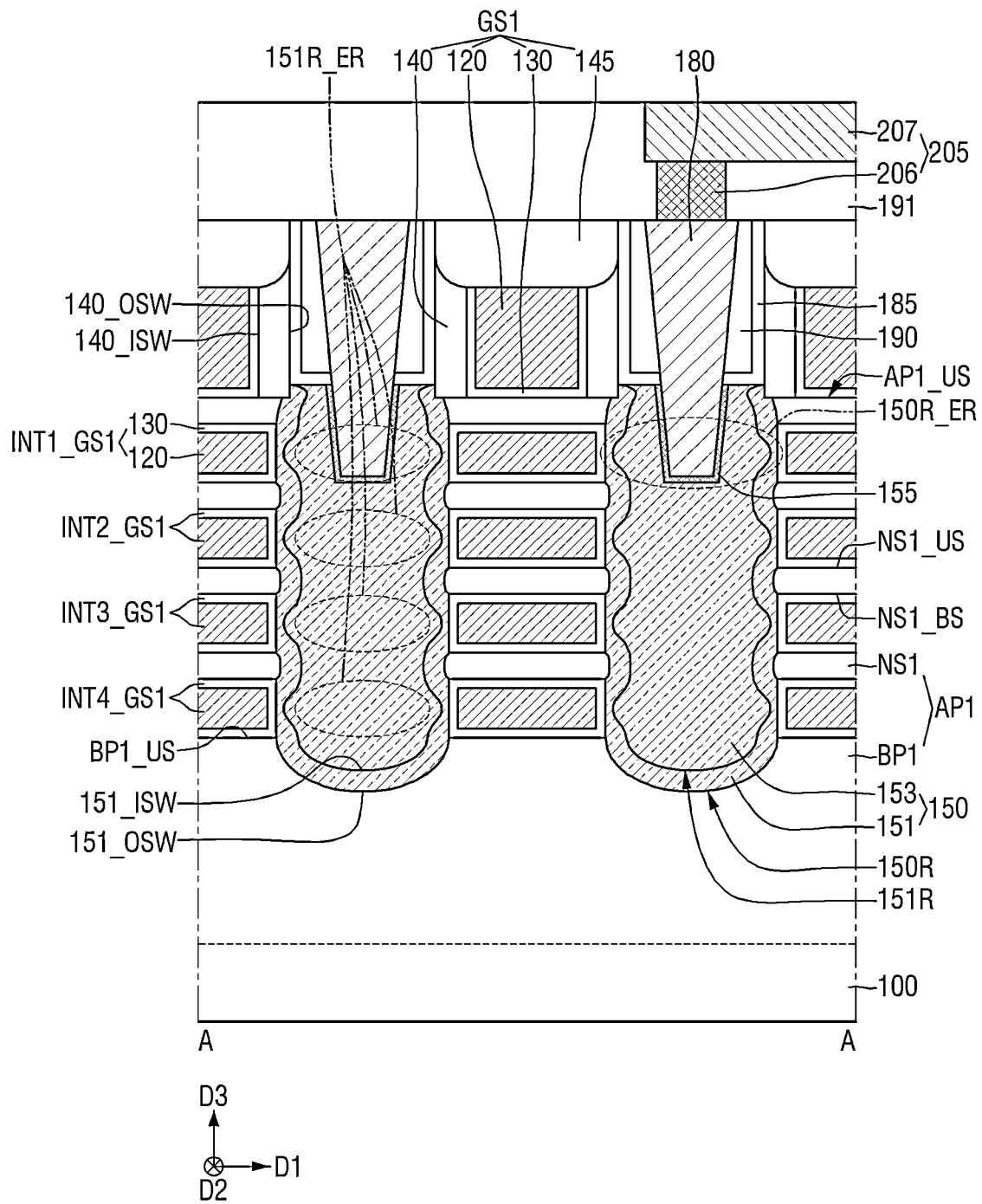
FIGS. 21 and 22 are diagrams for explaining a semiconductor device according to some example embodiments.
Figure 22:
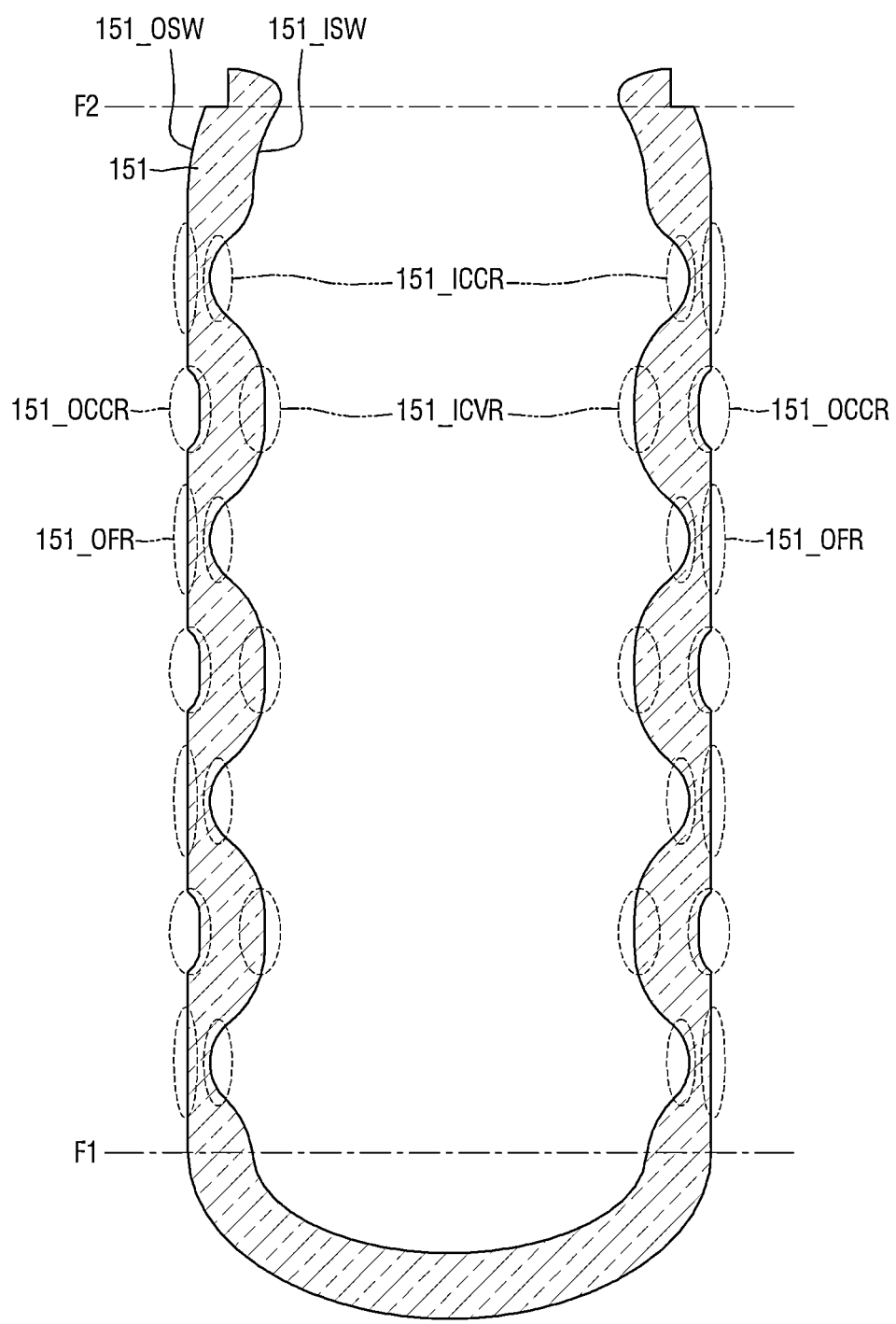
Figure 23:
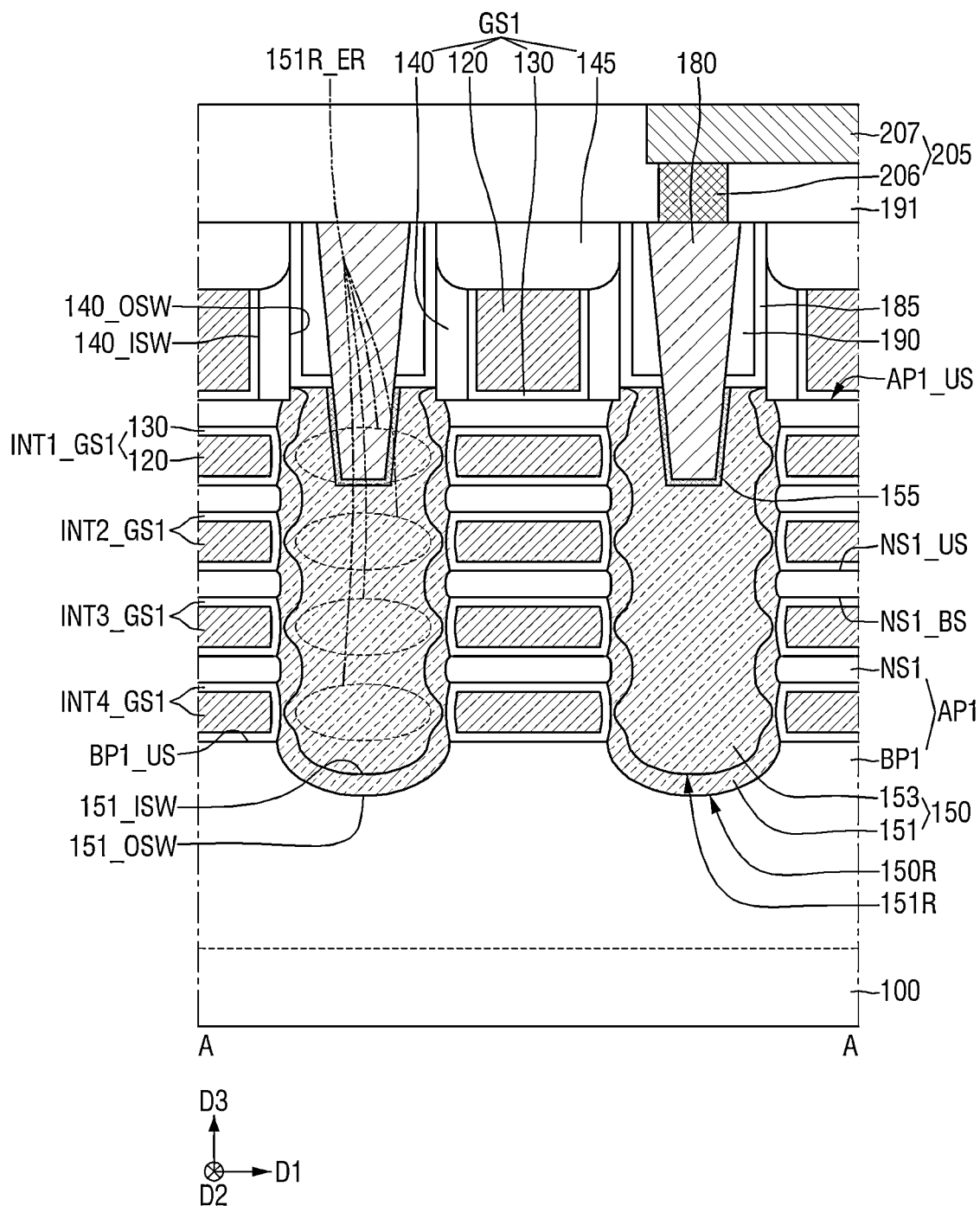
FIGS. 23 and 24 are diagrams for explaining a semiconductor device according to some example embodiments.
Figure 24:
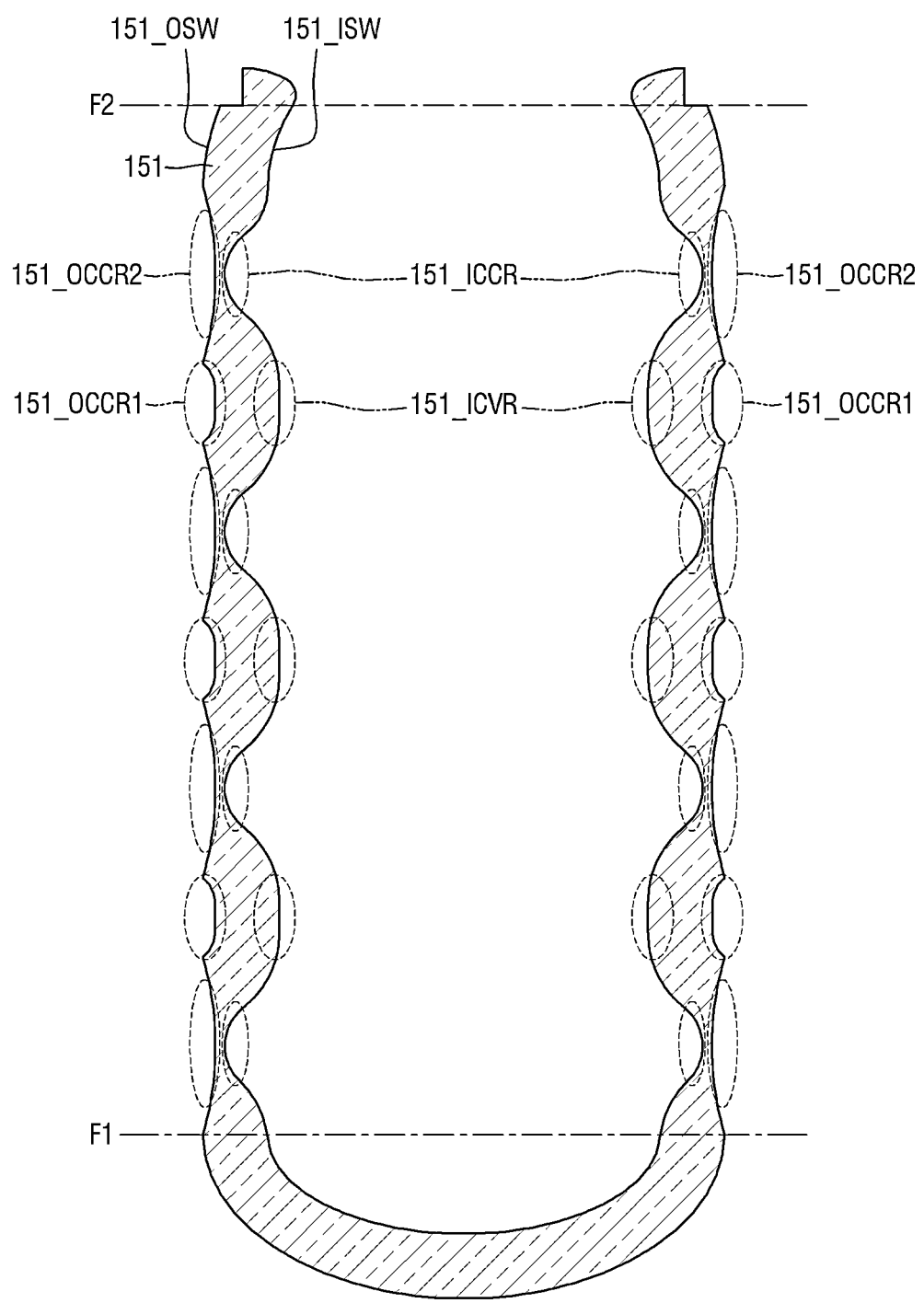

FIGS. 21 and 22 are diagrams for explaining a semiconductor device according to some example embodiments. FIG. 23 and FIG. 24 are diagrams for explaining a semiconductor device according to some example embodiments. For convenience of description, following descriptions are based on differences thereof from those as set forth above with reference to FIGS. 1 to 11.

For reference, FIG. 22 is a diagram to explain a shape of the semiconductor liner film of FIG. 21. FIG. 24 is a diagram to explain a shape of the semiconductor liner film of FIG. 23.

Referring to FIG. 21 and FIG. 22, in the semiconductor device according to some example embodiments, the outer surface 151_OSW of the semiconductor liner film may include a plurality of first outer flat areas 151_OFR and a plurality of first outer concavely-curved faces area 151_OCCR.

The first outer flat area 151_OFR may be disposed at a position corresponding to a position of the first inner concavely-curved face area 151_ICCR. The first outer flat area 151_OFR may contact the first gate insulating film 130 of each of the inner gate structures INT1_GS1, INT2_GS1, INT3_GS1, and INT4_GS1.

The first outer concavely-curved face area 151_OCCR may be positioned between the first outer flat areas 151_OFR adjacent to each other in the third direction D3. The first outer flat area 151_OFR may be positioned between the first outer concavely-curved face areas 151_OCCR adjacent to each other in the third direction D3.

The plurality of first outer flat areas 151_OFR and the plurality of first outer concavely-curved face areas 151_OCCR may be disposed above the first reference line F1. The plurality of first outer flat areas 151_OFR and the plurality of first outer concavely-curved face areas 151_OCCR may be disposed below the second reference line F2.

Referring to FIG. 23 and FIG. 24, in the semiconductor device according to some example embodiments, the outer surface 151_OSW of the semiconductor liner film may include a plurality of first sub-concavely-curved face areas 151_OCCR1 and a plurality of second sub-concavely-curved face areas 151_OCCR2.

For example, the first sub-concavely-curved face area 151_OCCR1 may be disposed at a position corresponding to a position of the first inner convexly-curved face area 151_ICVR. The second sub-concavely-curved face area 151_OCCR2 may be disposed at a position corresponding to a position of the first inner concavely-curved face area 151_ICCR.

The first sub-concavely-curved face area 151_OCCR1 may contact the first sheet pattern NS1. For example, the first sub-concavely-curved face area 151_OCCR1 may contact a side end of the first sheet pattern NS1.

The second sub-concavely-curved face area 151_OCCR2 may contact the first gate insulating film 130 of each of the inner gate structures INT1_GS1, INT2_GS1, and INT3_GS1.

The plurality of first sub-concavely-curved face areas 151_OCCR1 and the plurality of second sub-concavely-curved face areas 151_OCCR2 may be disposed above the first reference line F1. The plurality of first sub-concavely-curved face areas 151_OCCR1 and the plurality of second sub-concavely-curved face areas 151_OCCR2 may be disposed below the second reference line F2.

Figure 25:
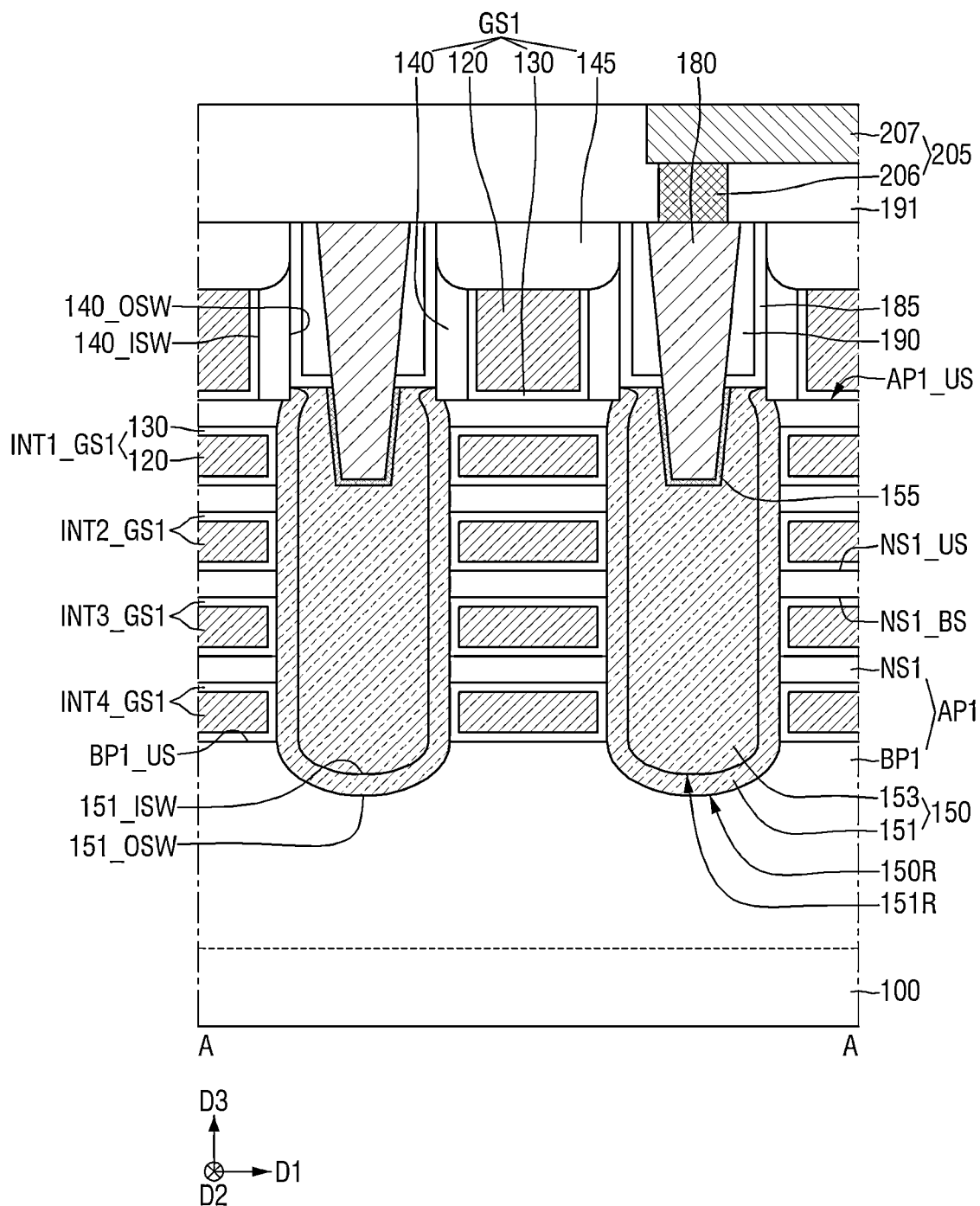
FIG. 25 is a diagram for explaining a semiconductor device according to some example embodiments.

FIG. 25 is a diagram for explaining a semiconductor device according to some example embodiments. For convenience of description, following descriptions are based on differences thereof from those as set forth above with reference to FIGS. 1 to 11.

Referring to FIG. 25, in the semiconductor device according to some example embodiments, a width in the first direction D1 of the liner recess 151R may increase and then decrease as the liner recess 151R moves away from the upper surface BP1_US of the first lower pattern.

The sidewall of the liner recess 151R does not have a wavy shape. The liner recess 151R does not include the plurality of width extension areas (151R_ER in FIG. 2).

Figure 26:
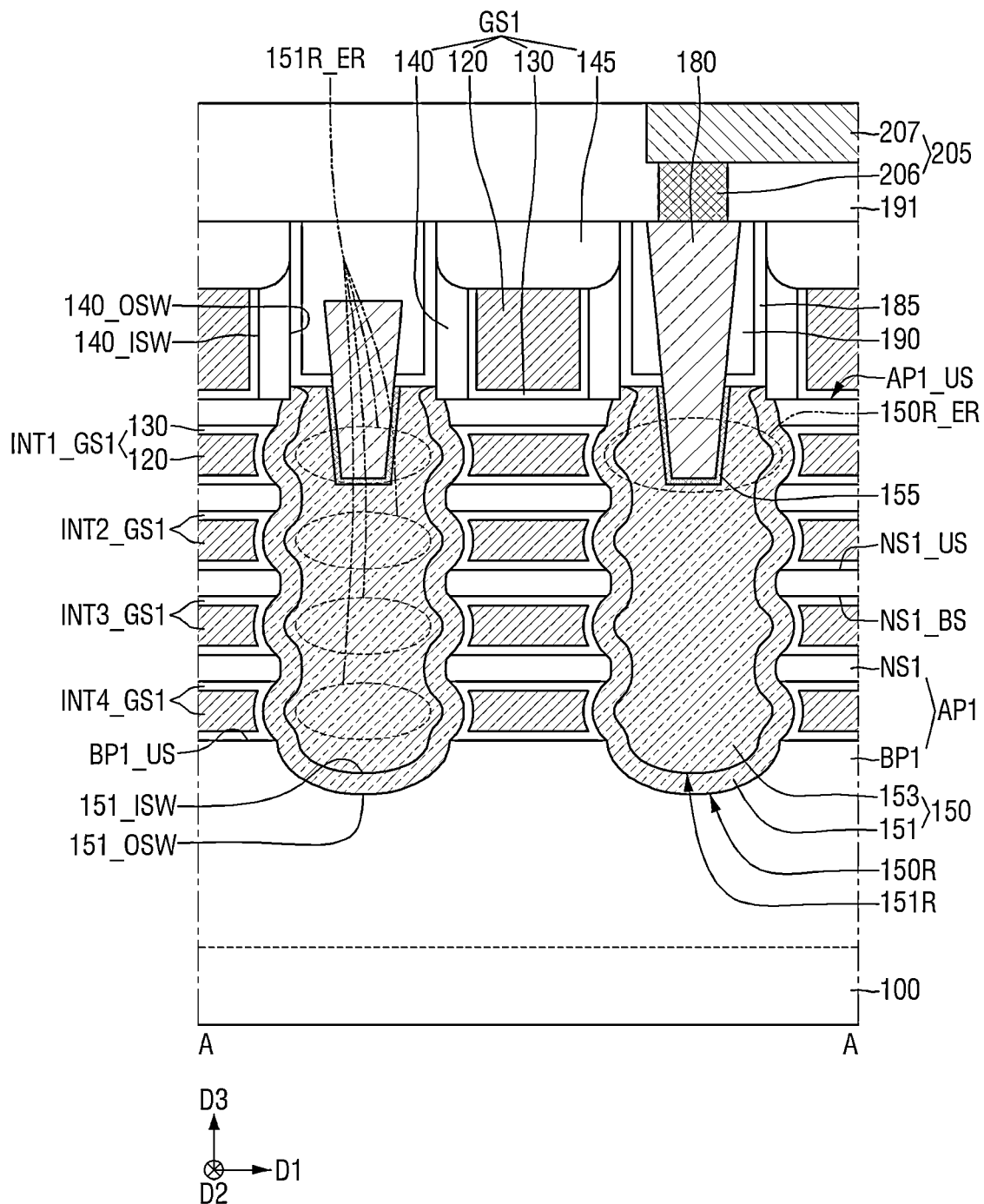
FIGS. 26 and 27 are diagrams for explaining semiconductor devices according to some example embodiments.
Figure 27:
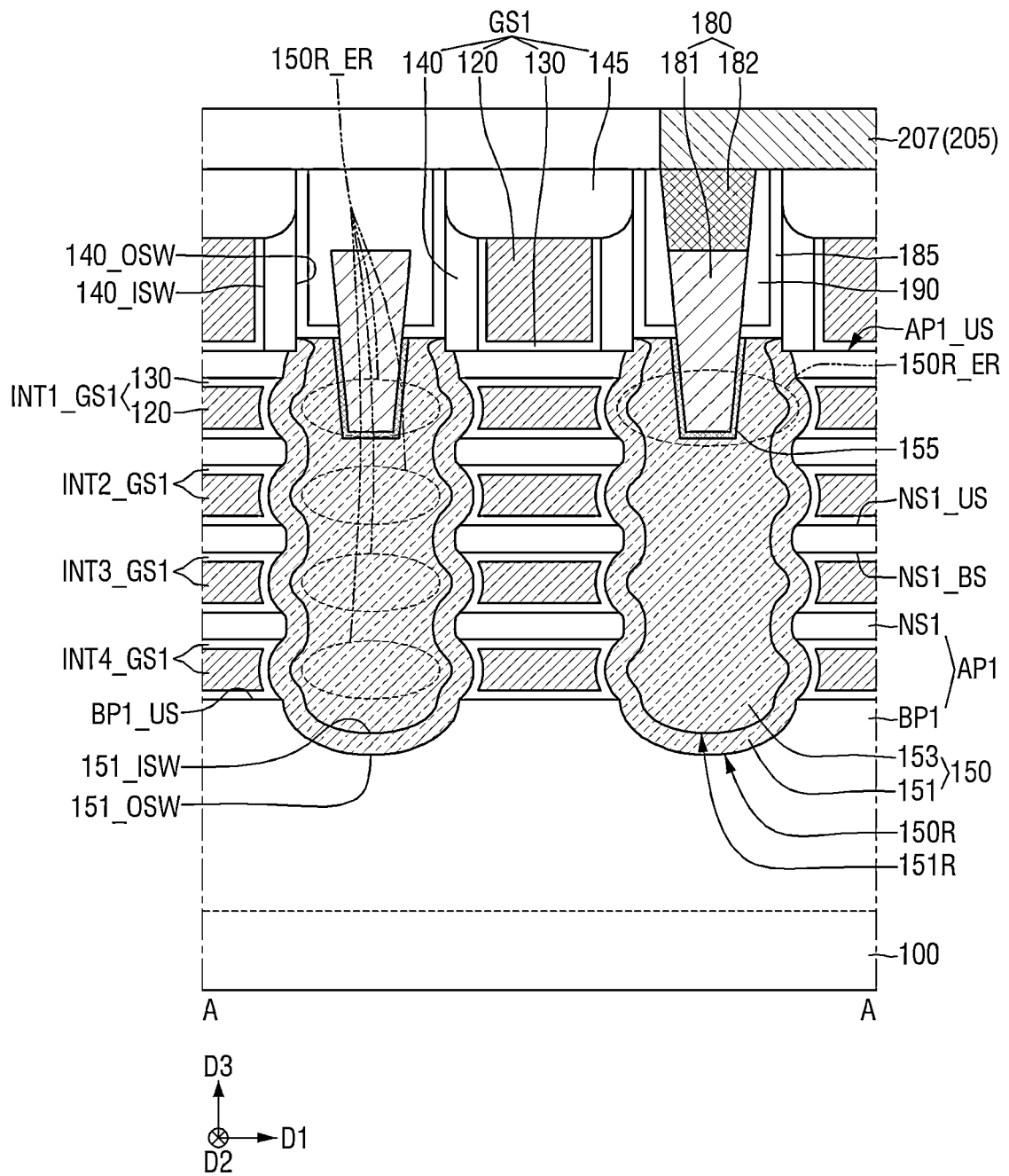

FIGS. 26 and 27 are diagrams for explaining semiconductor devices according to some example embodiments, respectively. For convenience of description, following descriptions are based on differences thereof from those as set forth above with reference to FIGS. 1 to 11.

Referring to FIG. 26, in the semiconductor device according to some example embodiments, a vertical level of an upper surface of a portion of the first source/drain contact 180 not connected to the wiring structure 205 is lower than that of the upper surface of the first gate capping pattern 145.

A vertical level of an upper surface of a portion of the first source/drain contact 180 connected to the wiring structure 205 is lower than that of an upper surface of a portion of the first source/drain contact 180 not connected to the wiring structure 205.

Referring to FIG. 27, in the semiconductor device according to some example embodiments, the first source/drain contact 180 includes a lower source/drain contact 181 and an upper source/drain contact 182.

The upper source/drain contact 182 may be disposed in the portion connected to the wiring structure 205. On the other hand, the upper source/drain contacts 182 may not be disposed in the portion not connected to the wiring structure 205.

The wiring line 207 may be directly connected to the first source/drain contact 180 without using the wiring via (206 in FIG. 2). The wiring structure 205 may not include the wiring via (206 in FIG. 2).

Although each of the lower source/drain contact 181 and the upper source/drain contact 182 is illustrated as being embodied as a single film, this is intended for convenience of explanation, and example embodiments are not limited thereto. Each of the lower source/drain contact 181 and the upper source/drain contact 182 may include, for example, at least one of a metal, a metal alloy, a conductive metal nitride, a conductive metal carbide, a conductive metal oxide, a conductive metal carbonitride, or a two-dimensional material.

Figure 28:
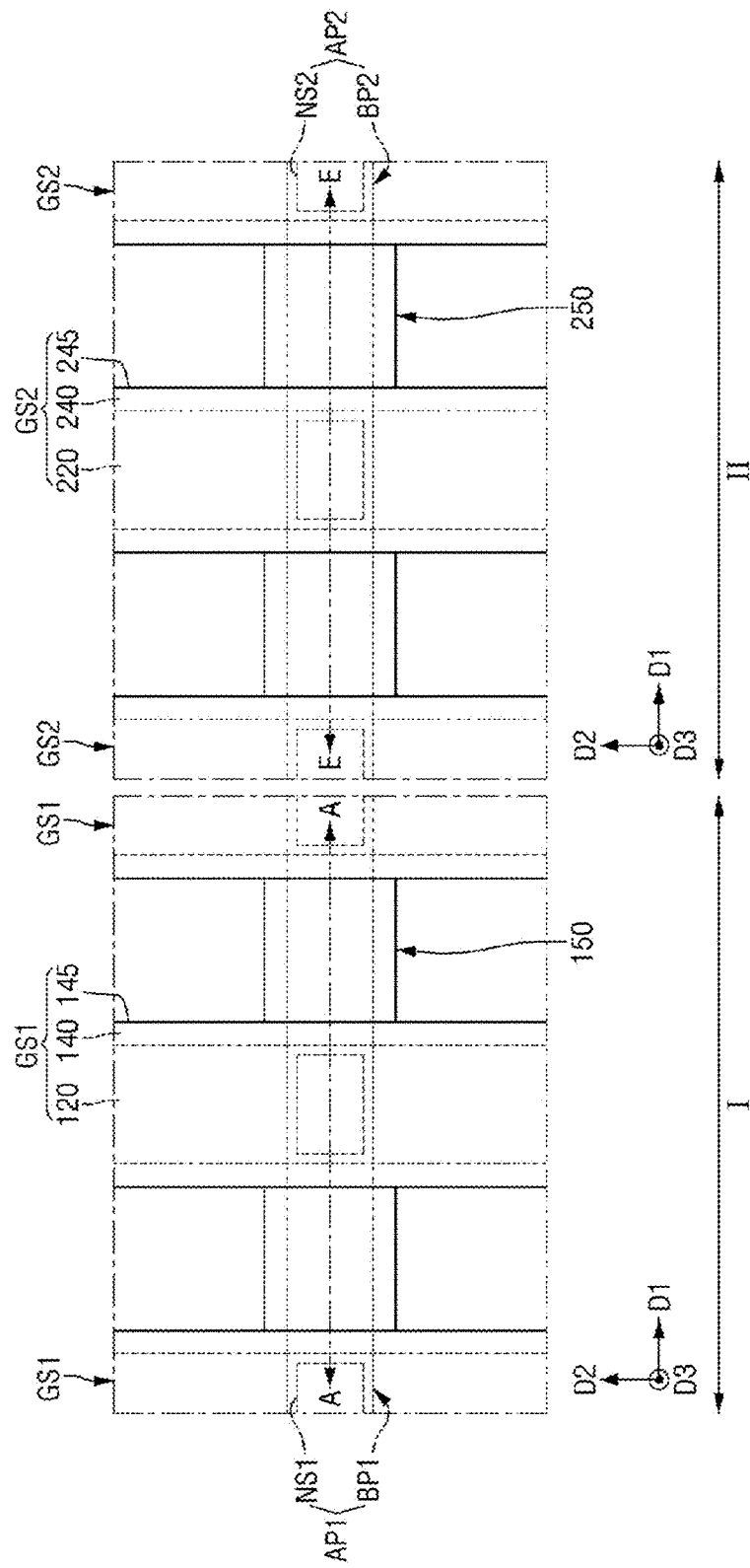
FIGS. 28 to 30 are diagrams for explaining a semiconductor device according to some example embodiments.
Figure 29:
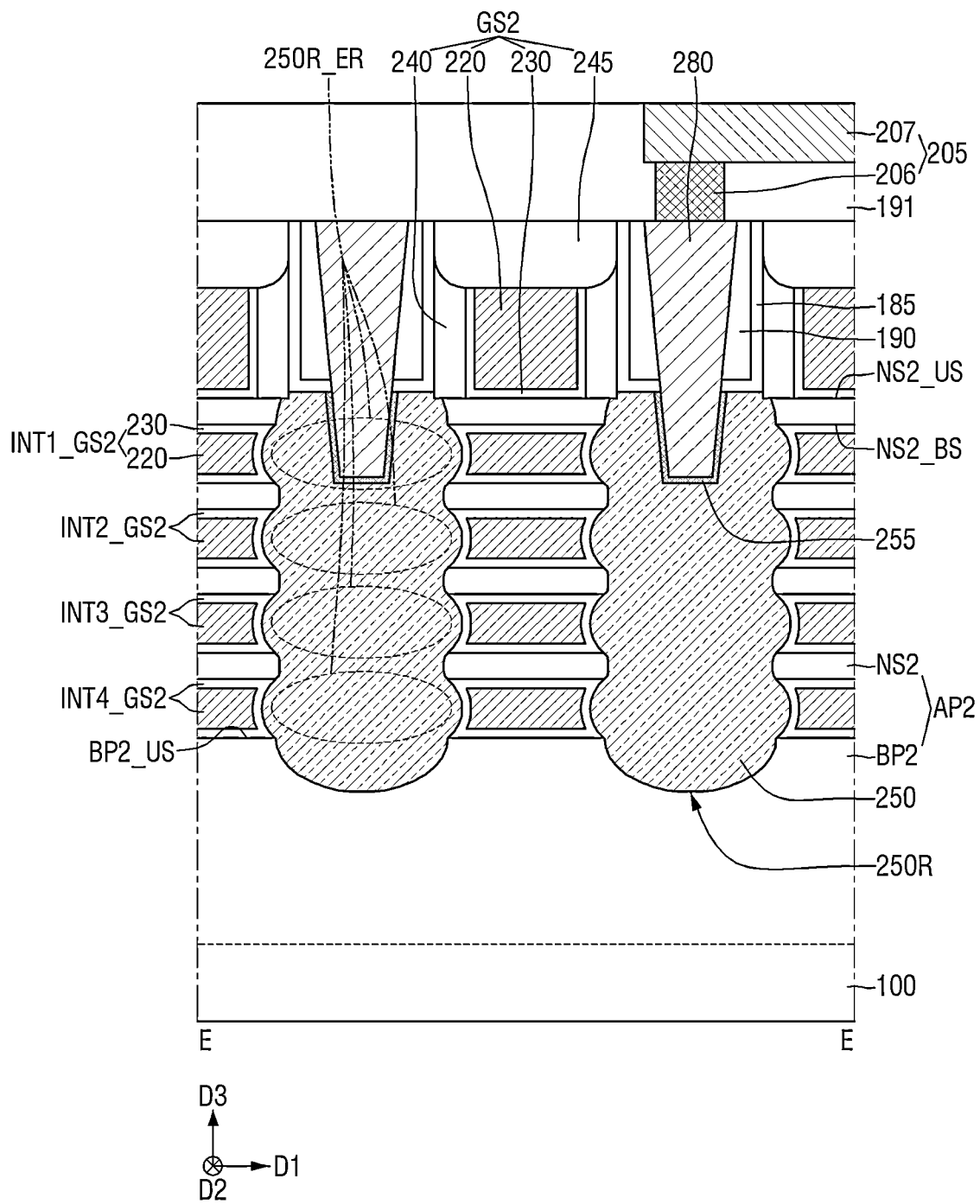
Figure 30:
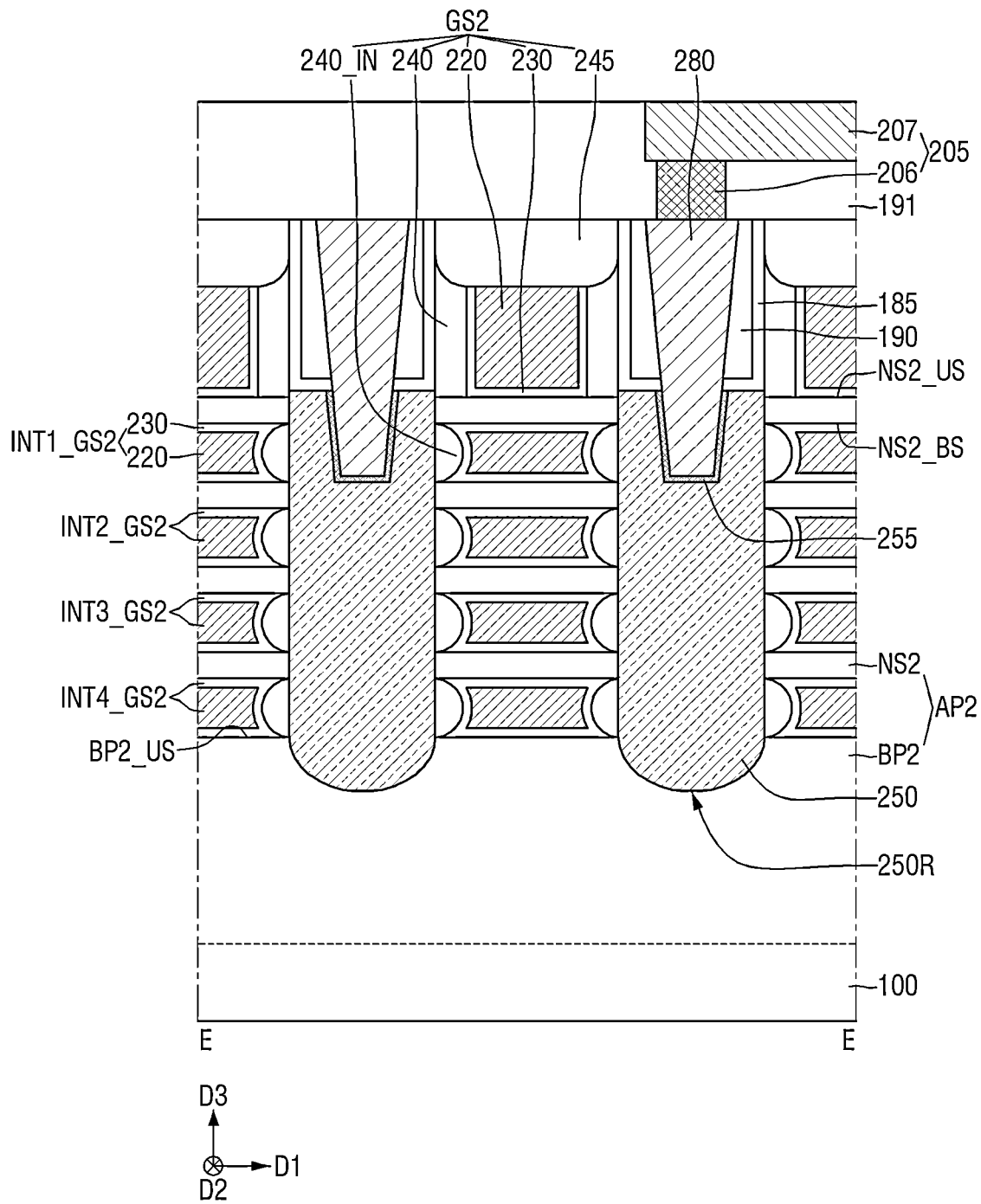

FIGS. 28 to 30 are diagrams for explaining a semiconductor device according to some example embodiments. For reference, FIG. 28 is an illustrative plan view for explaining a semiconductor device according to some example embodiments. FIG. 29 and FIG. 30 are cross-sectional views taken along E-E of FIG. 28.

Further, the cross-sectional view taken along A-A in FIG. 28 may be the same as one of FIG. 2, FIG. 12, FIG. 17, FIG. 19, FIG. 21, FIG. 23, and FIG. 25. In addition, descriptions about the first area I in FIG. 28 may be substantially the same as those set forth above using FIGS. 1 to 25. Therefore, following descriptions are based on contents of the second area II in FIG. 28.

Referring to FIG. 28 to FIG. 30, the semiconductor device according to some example embodiments may include a first active pattern AP1, a plurality of first gate structures GS1, a first source/drain pattern 150, a second active pattern AP2, a plurality of second gate structures GS2, and a second source/drain pattern 250.

The substrate 100 may include a first area I and a second area II. The first area I may be an area in which a PMOS is formed, and the second area II may be an area in which a NMOS is formed. Alternatively in some example embodiments the first area I may include NMOS transistors while the second area II may include PMOS transistors.

The first active pattern AP1, the plurality of first gate structures GS1, and the first source/drain pattern 150 are disposed on the first area I of the substrate 100. The second active pattern AP2, the plurality of second gate structures GS2, and the second source/drain pattern 250 are disposed on the second area II of the substrate 100.

The second active pattern AP2 may include a second lower pattern BP2 and a plurality of second sheet patterns NS2. The plurality of second sheet patterns NS2 is disposed on the upper surface BP2_US of the second lower pattern. The second sheet patterns NS2 includes an upper surface NS2_US and a bottom surface NS2_BS opposite to each other in the third direction D3.

Each of the second lower pattern BP2 and the second sheet pattern NS2 may include silicon or germanium as an elemental semiconductor material, a group IV-IV compound semiconductor, or group III-V compound semiconductor. In the semiconductor device according to some example embodiments, the second lower pattern BP2 may be a silicon lower pattern including silicon, and the second sheet pattern NS2 may be a silicon sheet pattern including silicon.

The plurality of second gate structures GS2 may be disposed on the substrate 100. The second gate structure GS2 may be disposed on the second active pattern AP2. The second gate structure GS2 may intersect the second active pattern AP2. The second gate structure GS2 may intersect the second lower pattern BP2. The second gate structure GS2 may surround each of the second sheet patterns NS2. The second gate structure GS2 may include a plurality of inner gate structures INT1_GS2, INT2_GS2, INT3_GS2, and INT4_GS4 respectable disposed between the second sheet patterns NS2 adjacent to each other in the third direction D3 and between the second lower pattern BP2 and the second sheet pattern NS2. The second gate structure GS2 may include, for example, a second gate electrode 220, a second gate insulating film 230, a second gate spacer 240, and a second gate capping pattern 245.

In FIG. 29, the second gate spacer 240 is not disposed between each of the plurality of inner gate structures INT1_GS2, INT2_GS2, INT3_GS2, and INT4_GS4 and the second source/drain pattern 250. The second gate insulating film 230 included in each of the inner gate structures INT1_GS2, INT2_GS2, INT3_GS2, and INT4_GS4 may be in contact with the second source/drain pattern 250.

In FIG. 30, the second gate structure GS2 may include an inner spacer 240_IN. The inner spacers 240_IN may be respectively disposed between the second sheet patterns NS2 adjacent to each other in the third direction D3 and between the second lower pattern BP2 and the second sheet pattern NS2. The inner spacer 240_IN may contact the second gate insulating film 230 included in each of the inner gate structures INT1_GS2, INT2_GS2, INT3_GS2, and INT4_GS4. The inner spacer 240_IN may define a portion of a second source/drain recess 250R.

The second source/drain pattern 250 may be formed on the second active pattern AP2. The second source/drain pattern 250 may be formed on the second lower pattern BP2. The second source/drain pattern 250 may be connected to the second sheet pattern NS2. The second source/drain pattern 250 may be included in a source/drain of a transistor using the second sheet pattern NS2 as a channel area thereof.

The second source/drain pattern 250 may be disposed in the second source/drain recess 250R. A bottom surface of the second source/drain recess 250R may be defined by the second lower pattern BP2. A sidewall of the second source/drain recess 250R may be defined by the second nanosheet NS2 and the second gate structure GS2.

In FIG. 29, the second source/drain recess 250R may include a plurality of width extension areas 250R_ER. Each of the width extension areas 250R_ER of the second source/drain recess may be defined above the upper surface BP2_US of the second lower pattern.

In FIG. 30, the second source/drain recess 250R does not include the plurality of width extension areas (250R_ER in FIG. 29). The sidewall of the second source/drain recess 250R may not have a wavy shape.

The second source/drain pattern 250 may include an epitaxial pattern. The second source/drain pattern 250 may include, for example, silicon or germanium as an elemental semiconductor material. Alternatively, the second source/drain pattern 250 may include at least one of a binary compound including two of carbon (C), silicon (Si), germanium (Ge), and tin (Sn), a ternary compound including three of carbon (C), silicon (Si), germanium (Ge), and tin (Sn), or a compound obtained by doping a group IV element thereto. For example, the second source/drain pattern 250 may include, but is not limited to, one or more of silicon, silicon-germanium, germanium, silicon carbide, or the like.

The second source/drain pattern 250 may contain impurities doped into the semiconductor material. For example, the second source/drain pattern 250 may include n-type impurities. The doped n-type impurity may include at least one of phosphorus (P), arsenic (As), antimony (Sb), or bismuth (Bi) at the same or different concentrations.

A second source/drain contact 280 is disposed on the second source/drain pattern 250. The second source/drain contact 280 is connected to the second source/drain pattern 250.

A second contact silicide film 255 may be further disposed between the second source/drain contact 280 and the second source/drain pattern 250.

FIGS. 31 to 38 are diagrams of intermediate structures corresponding to intermediate steps for explaining a semiconductor device manufacturing method according to some example embodiments. For reference, FIG. 31 to FIG. 38 may be cross-sectional views taken along A-A of FIG. 1.

Figure 31:
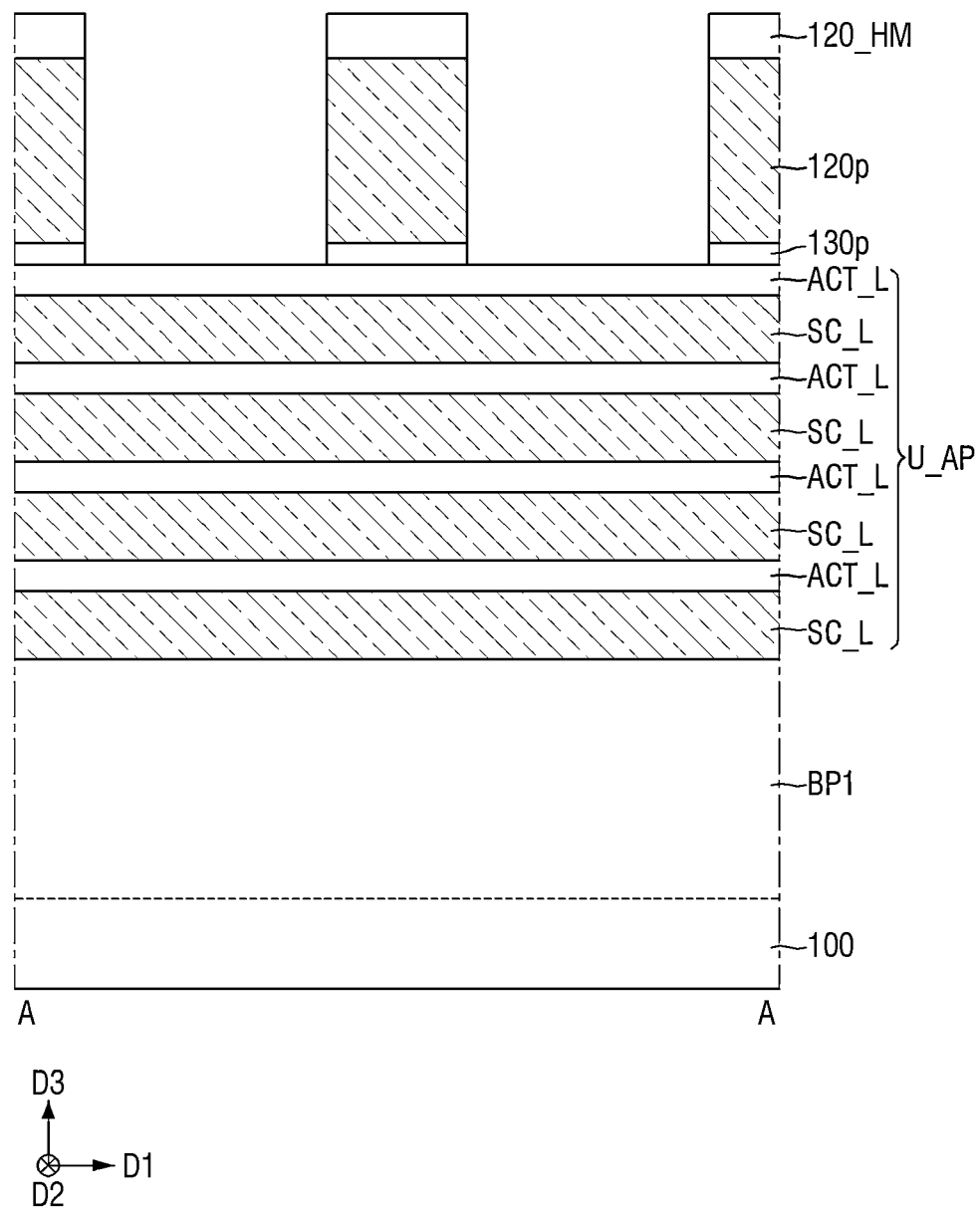
FIGS. 31 to 38 are diagrams of intermediate structures corresponding to intermediate steps for explaining a semiconductor device manufacturing method according to some example embodiments.

Referring to FIG. 31, the first lower pattern BP1 and an upper pattern structure U_AP may be formed on the substrate 100.

The upper pattern structure U_AP may be disposed on the first lower pattern BP1. The upper pattern structure U_AP may include a plurality of sacrificial patterns SC_L and a plurality of active patterns ACT_L alternately stacked on top of each other while being disposed on the first lower pattern BP1.

For example, the sacrificial pattern SC_L may include a silicon-germanium film. The active pattern ACT_L may include a silicon film.

Subsequently, a dummy gate insulating film 130$p$, a dummy gate electrode 120$p$, and a dummy gate capping film 120_HM may be formed on the upper pattern structure U_AP, e.g. with a deposition process such as but not limited to a chemical vapor deposition (CVD) process and/or an atomic layer deposition (ALD) process. The dummy gate insulating film 130$p$ may include, for example, but is not limited to, silicon oxide. The dummy gate electrode 120$p$ may include, for example, but is not limited to, polysilicon. The dummy gate capping film 120_HM may include, for example, but is not limited to, silicon nitride.

Figure 32:
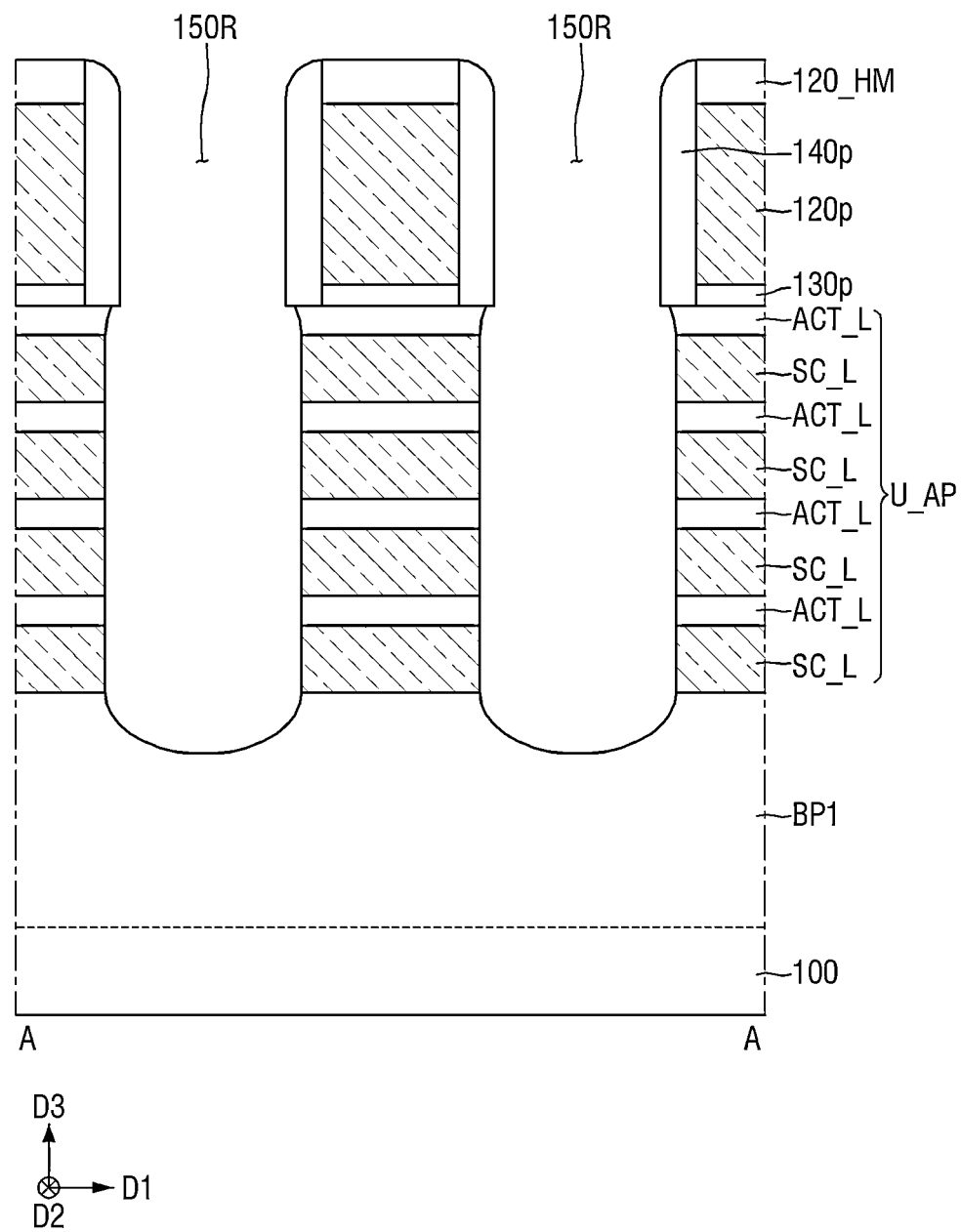
Figure 33:
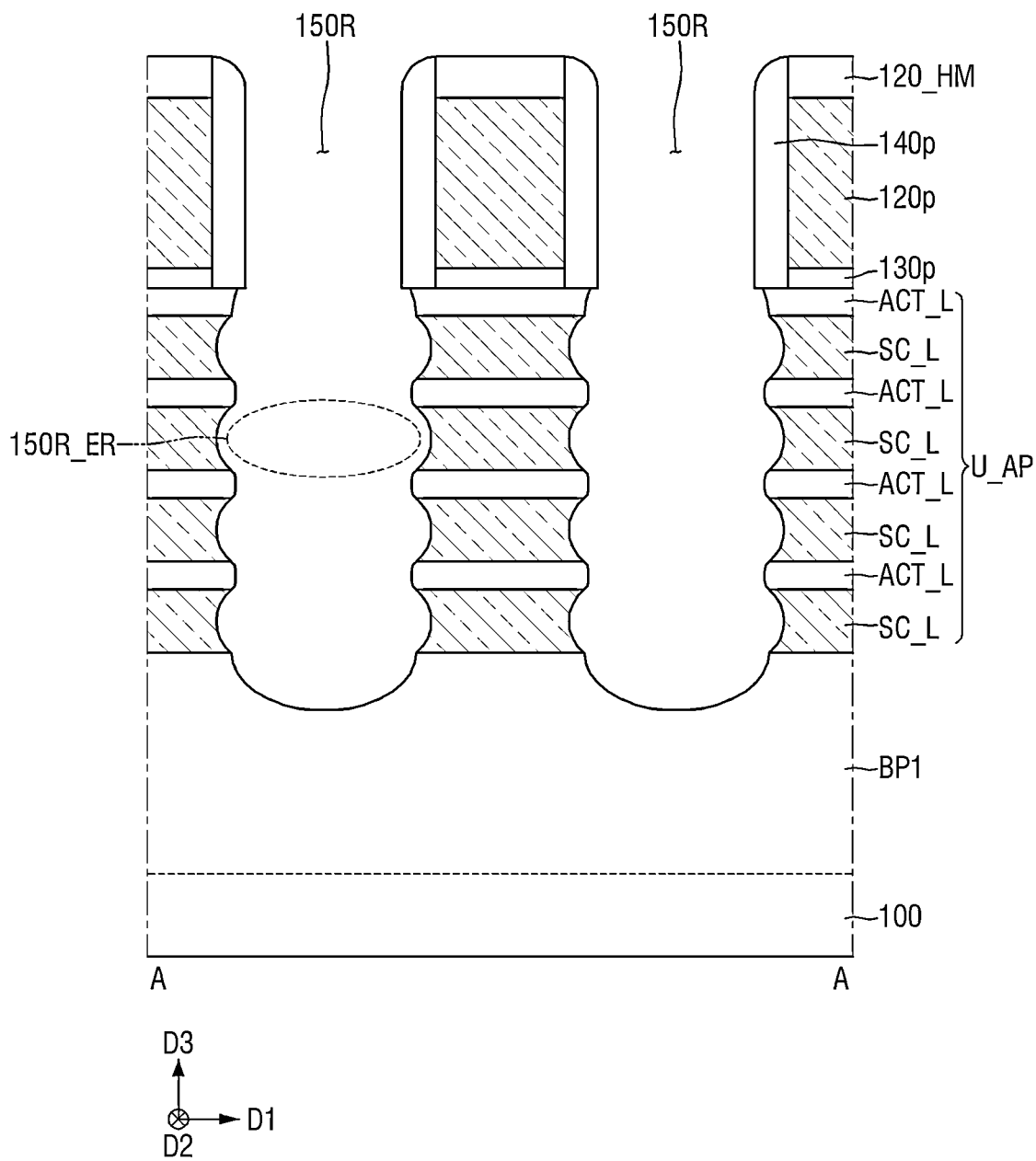

Referring to FIG. 32 and FIG. 33, a pre-gate spacer 140$p$ may be formed on a sidewall of the first dummy gate electrode 120$p$.

The first source/drain recess 150R may be formed in the upper pattern structure U_AP, using dummy gate electrode 120$p$ and the pre-gate spacer 140$p$ as a mask. The pre-gate spacer 140$p$ may be formed and then the first source/drain recess 150R may be continuously formed.

A portion of the first source/drain recess 150R may be formed in the first lower pattern BP1. A bottom surface of the first source/drain recess 150R may be defined by the first lower pattern BP1.

The first source/drain recess 150R as shown in FIG. 32 may be formed, and then, the sacrificial pattern SC_L may be additionally etched. Thus, the width extension area 150R_ER of the first source/drain recess may be formed.

The first source/drain recess 150R may include the plurality of width extension areas 150R_ER. A sidewall of the first source/drain recess 150R may have a wavy shape. However, a scheme of forming the first source/drain recess 150R including the plurality of width extension areas 150R_ER is not limited to the above description.

The first source/drain recess 150R may have the same shape as that in one of FIG. 32 and FIG. 33. Following description is made using FIG. 33.

Figure 34:
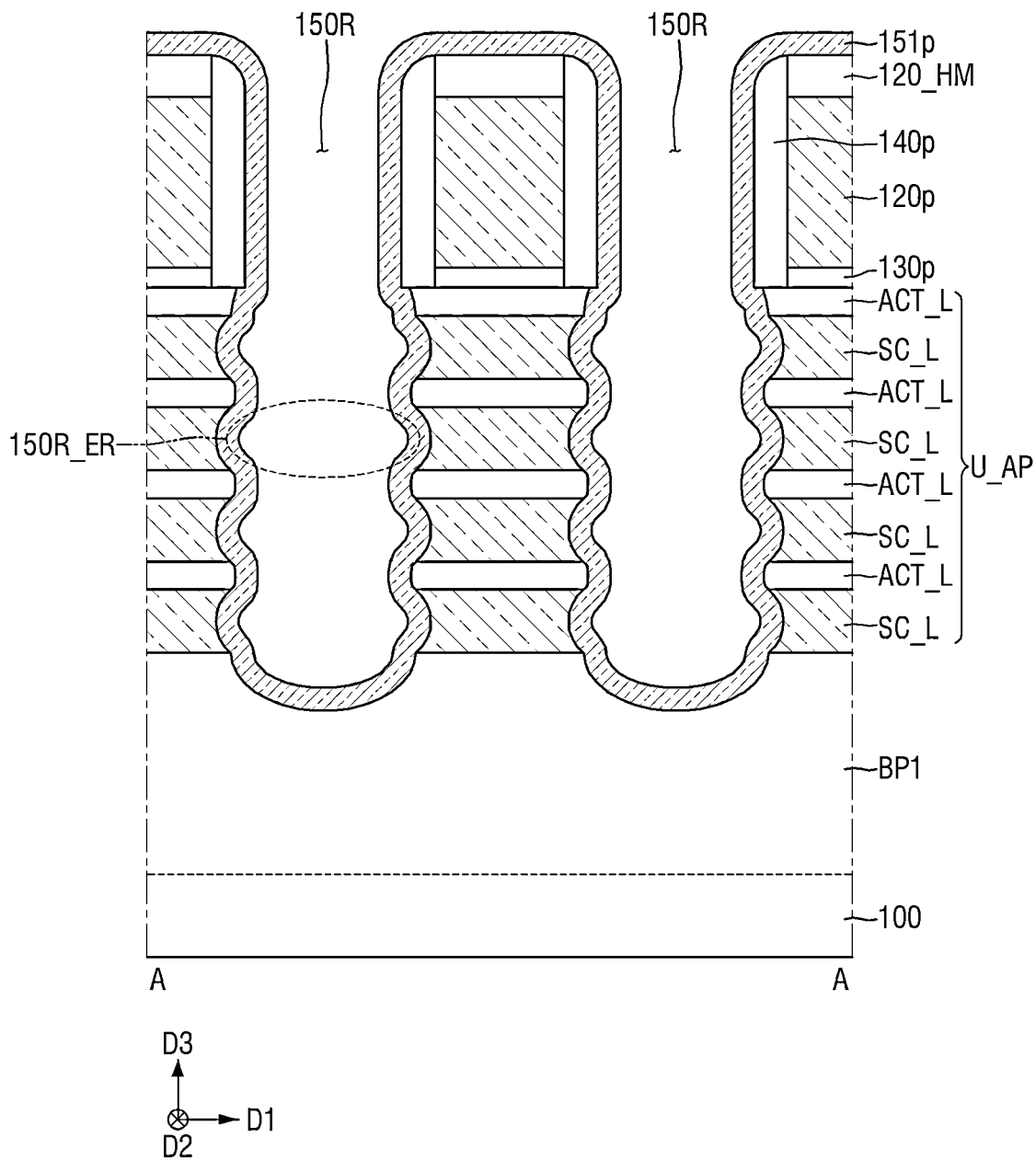

Referring to FIG. 34, a pre-semiconductor liner film 151$p$ may be formed along the sidewall and the bottom surface of the first source/drain recess 150R.

The pre-semiconductor liner film 151$p$ may be formed along a sidewall of the pre-gate spacer 140$p$ and an upper surface of the dummy gate capping film 120_HM. For example, the pre-semiconductor liner film 151*p* may be conformally formed. The pre-semiconductor liner film 151*p* may be formed using an epitaxial growth scheme.

Figure 35:
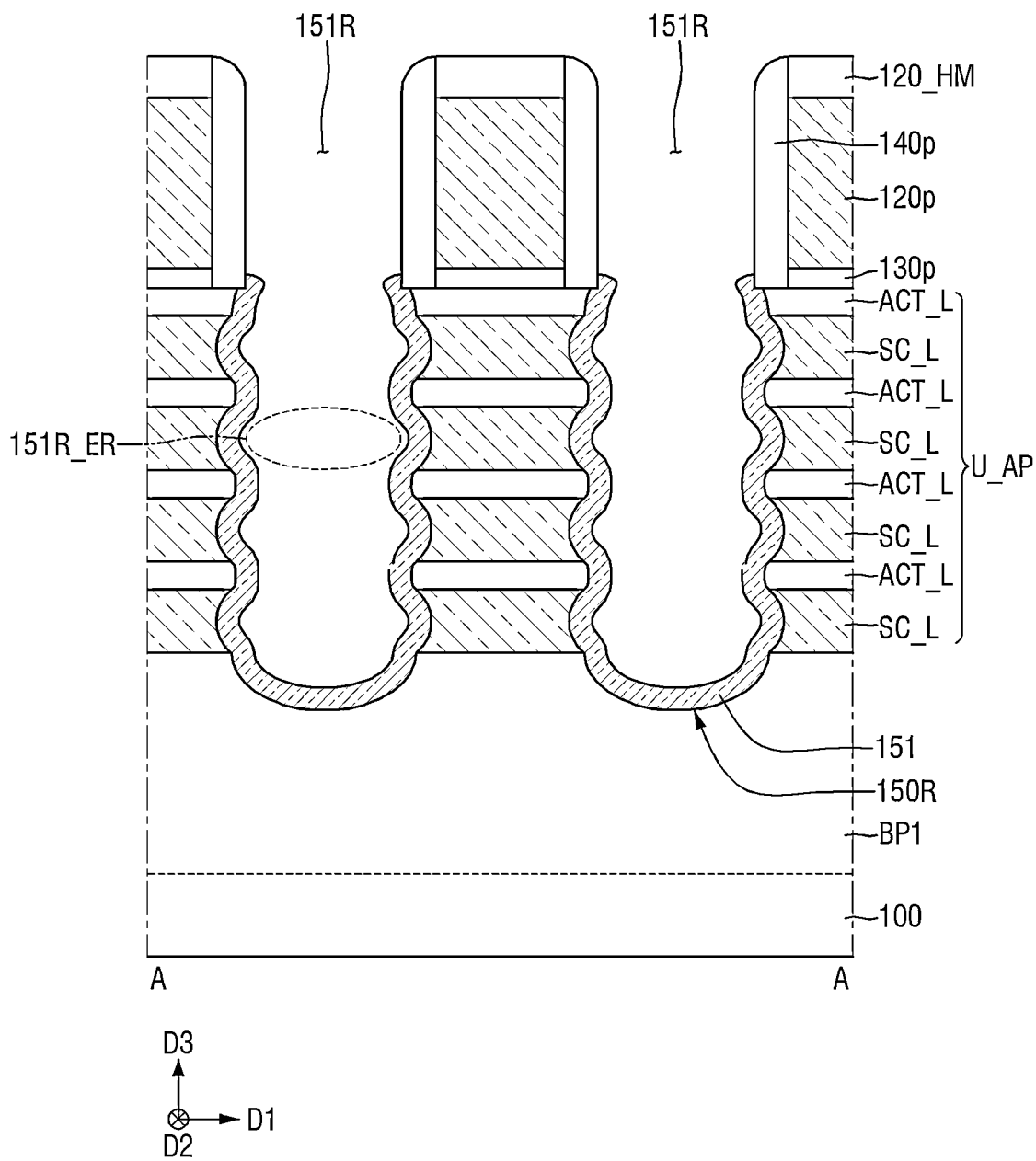

Referring to FIG. 35, a portion of the pre-semiconductor liner film 151*p* formed along the sidewall of the pre-gate spacer 140*p* and the upper surface of the dummy gate capping film 120_HM may be removed such that the semiconductor liner film 151 may be formed on the first lower pattern BP1.

An etch rate of the portion of the pre-semiconductor liner film 151*p* formed along the sidewall of the pre-gate spacer 140*p* and the upper surface of the dummy gate capping film 120_HM may be greater than an etch rate of a portion of the pre-semiconductor liner film 151*p* formed along a profile of the first source/drain recess 150R. While the portion of the pre-semiconductor liner film 151*p* formed along the sidewall of the pre-gate spacer 140*p* and the upper surface of the dummy gate capping film 120_HM is etched, the portion of the pre-semiconductor liner film 151*p* formed along the profile of the first source/drain recess 150R may remain. During an etching process of forming the semiconductor liner film 151, the portion of the pre-semiconductor liner film 151*p* formed on the sidewall of the pre-gate spacer 140*p* may not be etched.

For example, the semiconductor liner film 151 may be conformally formed (e.g., deposited) along the sidewall and the bottom surface of the first source/drain recess 150R.

The semiconductor liner film 151 may define the liner recess 151R corresponding to the sidewall of the first source/drain recess 150R. For example, a sidewall of the liner recess 151R may have a wavy shape similar to that of the sidewall of the first source/drain recess 150R. The liner recess 151R may include the plurality of width extension areas 151R_ER.

Figure 36:
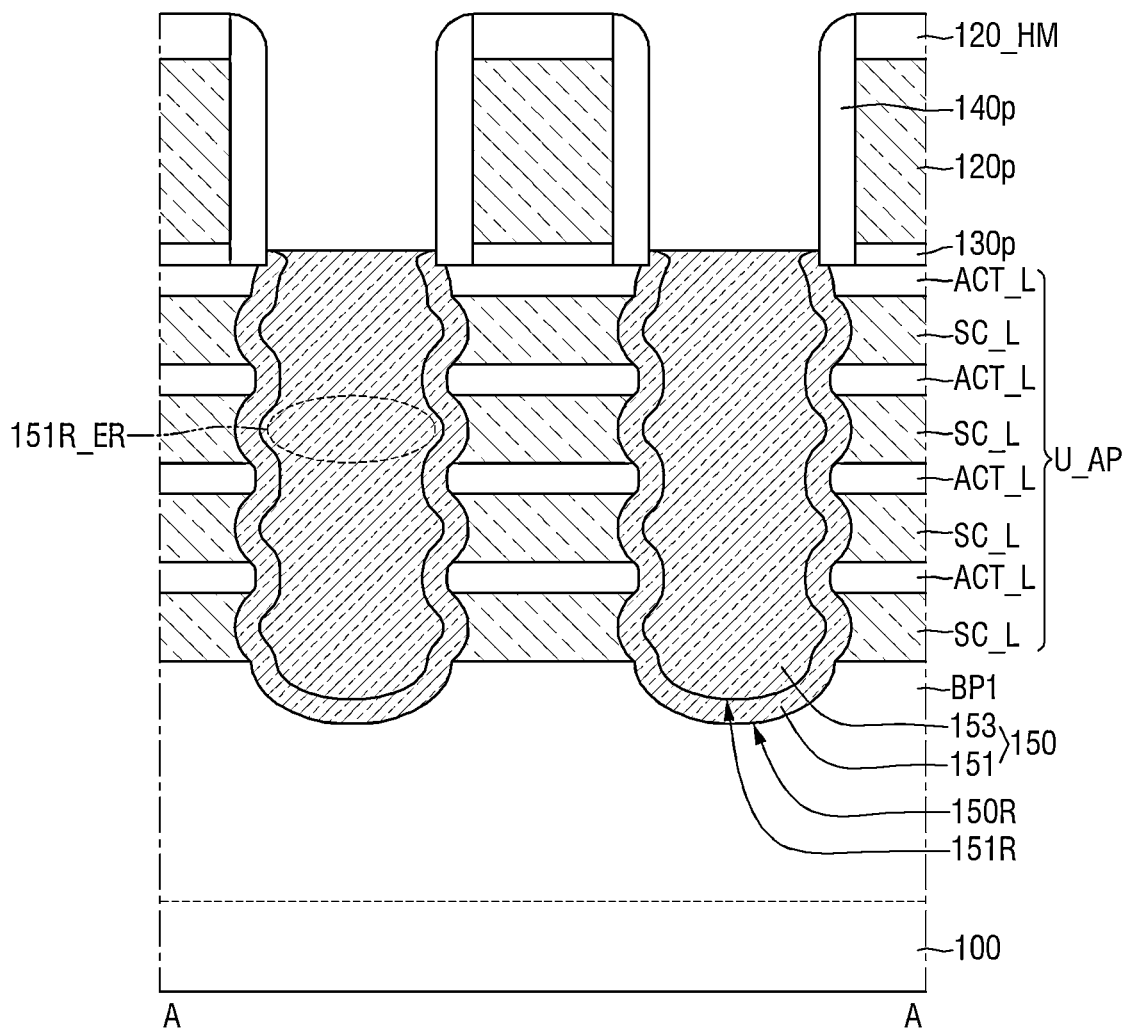

Referring to FIG. 36, the semiconductor filling film 153 may be formed on the semiconductor liner film 151.

The semiconductor filling film 153 is formed in the liner recess 151R. The semiconductor filling film 153 fills the liner recess 151R. The semiconductor filling film 153 may be formed using an epitaxial growth scheme.

Figure 37:
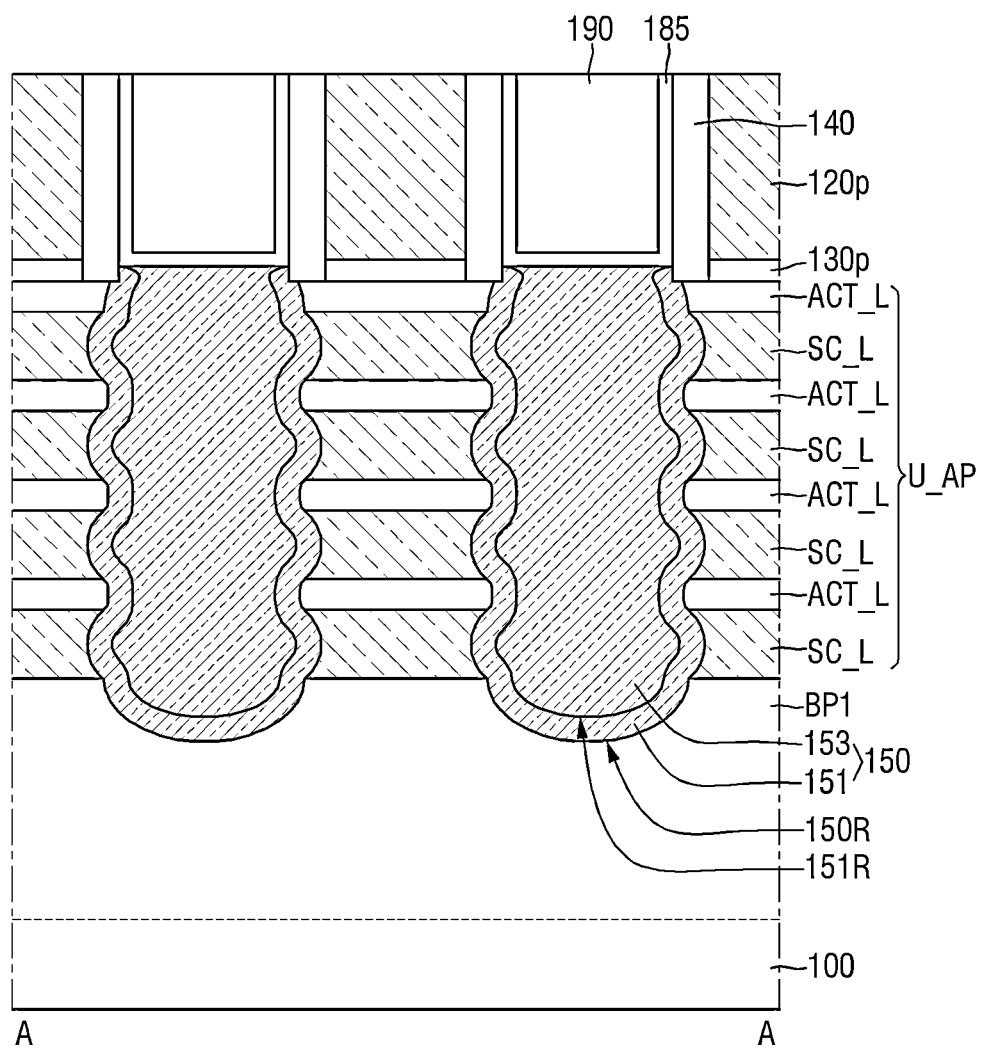

Referring to FIG. 37, the source/drain etch stop film 185 and the first interlayer insulating film 190 are sequentially formed on the first source/drain pattern 150.

Next, a portion of the first interlayer insulating film 190, a portion of the source/drain etch stop film 185, and the dummy gate capping film 120_HM are removed to expose an upper surface of the dummy gate electrode 120*p*. While the upper surface of the dummy gate electrode 120*p* is exposed, the first gate spacer 140 may be formed.

Figure 38:
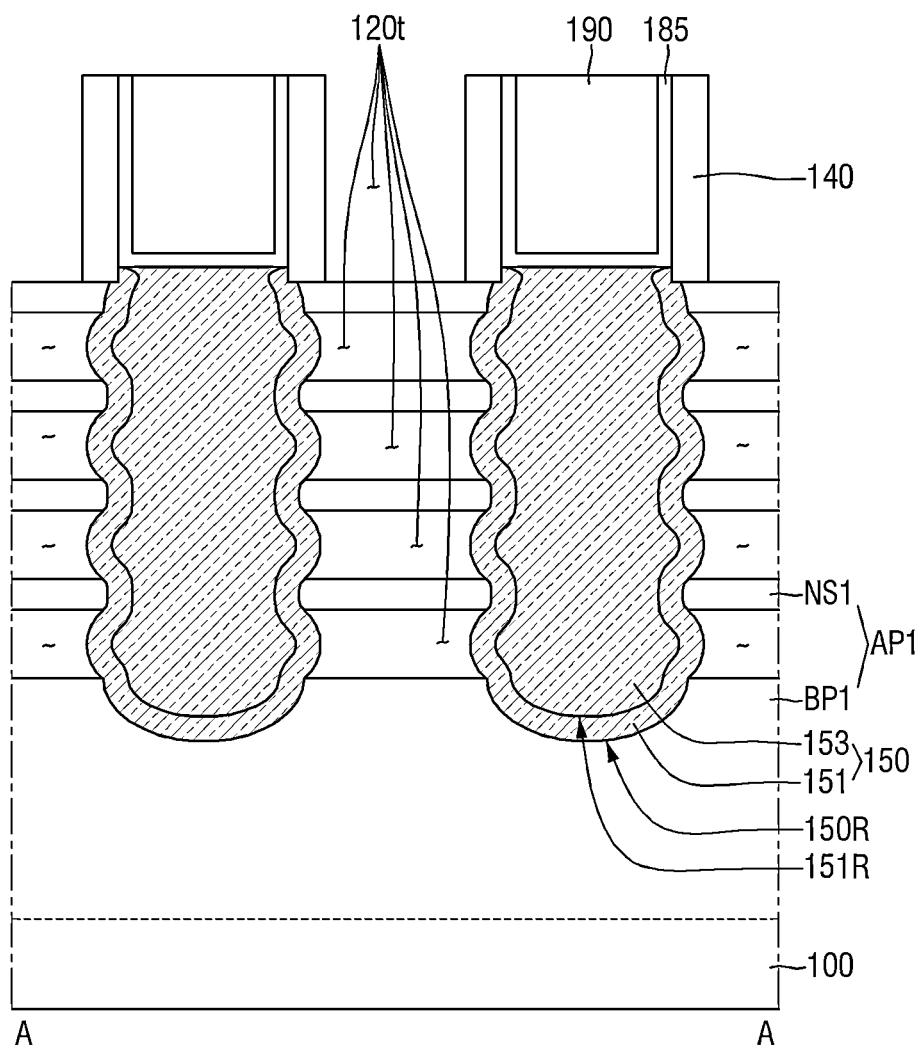

Referring to FIG. 37 and FIG. 38, the upper pattern structure U_AP between the first gate spacers 140 may be exposed by removing the dummy gate insulating film 130*p* and the dummy gate electrode 120*p*.

Subsequently, the sacrificial patterns SC_L may be removed such that the first sheet patterns NS1 may be formed. The first sheet patterns NS1 is connected to the first source/drain pattern 150. Thus, the first active pattern AP1 including the first lower pattern BP1 and the first sheet patterns NS1 is formed.

Further, the sacrificial patterns SC_L may be removed such that gate trenches 120*t* are formed between the first gate spacers 140. When the sacrificial patterns SC_L are removed, a portion of the first source/drain pattern 150 may be exposed.

Unlike what is illustrated, while the sacrificial patterns SC_L are removed, a portion of the semiconductor liner film 151 including silicon-germanium may also be removed. In this case, the outer sidewall of the semiconductor liner film 151 may have a shape as shown in either FIG. 21 or FIG. 23.

In FIG. 4 to FIG. 6, a thickness of a portion of the semiconductor liner film 151 contacting the first gate insulating film 130 of each of the inner gate structures INT1_GS1, INT2_GS1, INT3_GS1, and INT4_GS1 may be as large as a thickness of a portion of the semiconductor liner film 151 contacting each of the first sheet patterns NS1.

While removing the sacrificial patterns SC_L, an etchant which has etched away the sacrificial patterns SC_L may flow through a portion near the connection sidewall (140_CSW) in FIG. 4 of the first gate spacer. Then, the etchant may etch the semiconductor inserted film 152 and/or the semiconductor filling film 153, and thus reliability and performance of the semiconductor device may be deteriorated.

However, the semiconductor liner film 151 is conformally formed, such that a thickness in the first direction D1 of a portion of the semiconductor liner film 151 in contact with the connection sidewall 140_CSW of the first gate spacer increases.

As the contact thickness between the semiconductor liner film 151 and the first gate spacers 140 increases, the etchant which has etched away the sacrificial patterns SC_L may be prevented from flowing through the connection sidewall 140_CSW of the first gate spacer into the semiconductor inserted film 152 and/or the semiconductor filling film 153. This may prevent the semiconductor inserted film 152 and/or the semiconductor filling film 153 from being etched by the etchant.

Subsequently, referring to FIG. 2, the first gate insulating film 130 and the first gate electrode 120 may be formed inside the gate trench 120*t*. Further, the first gate capping pattern 145 may be formed.

In concluding the detailed description, those of ordinary skill in the art will appreciate that many variations and modifications may be made to described example embodiments without substantially departing from the principles of inventive concepts. Therefore, variously described example embodiments of the invention are used in a generic and descriptive sense only and not for purposes of limitation.

What is claimed is:
1. A semiconductor device comprising:
an active pattern including a lower pattern extending in a first direction, and a plurality of sheet patterns spaced apart from the lower pattern in a second direction, wherein the plurality of sheet patterns include an uppermost sheet pattern;
a plurality of gate structures on the lower pattern and spaced apart from each other in the first direction, wherein each of the plurality of gate structures includes a gate electrode and a gate insulating film; and
a source/drain pattern between adjacent ones of the plurality of gate structures, wherein the source/drain pattern includes a semiconductor liner film and a semiconductor filling film on the semiconductor liner film, wherein
at least one of the plurality gate structures includes an inner gate structure between the lower pattern and a lowermost sheet pattern among the plurality of sheet patterns, and an inner gate structure between adjacent ones of the plurality of sheet patterns, each of the inner gate structures including the gate electrode and the gate insulating film, the semiconductor liner film includes silicon-germanium, and is in contact with the gate insulating film of each of the inner gate structures, and a portion of the semiconductor liner film protrudes upwardly in the second direction beyond an upper surface of the uppermost sheet pattern.

2. The semiconductor device of claim 1, wherein the semiconductor liner film includes an outer surface contacting the plurality of sheet patterns and an inner surface facing the semiconductor filling film, a liner recess defined by the inner surface of the semiconductor liner film includes a plurality of width extension areas, and a width in the first direction of each of the width extension areas increases and then decreases as each of the width extension areas moves away from an upper surface of the lower pattern.

3. The semiconductor device of claim 2, wherein a point in the width extension area among the plurality of width extension areas at which the width in the first direction of the width extension area is the largest is positioned between the lower pattern and the lowermost sheet pattern, and between the plurality of sheet patterns adjacent to each other in the second direction.

4. The semiconductor device of claim 2, wherein the inner surface of the semiconductor liner film includes a plurality of convexly-curved face areas and a plurality of concavely-curved face areas.

5. The semiconductor device of claim 1, wherein the semiconductor liner film includes an outer surface contacting the plurality of sheet patterns and an inner surface facing the semiconductor filling film, and a width of a liner recess defined by the inner surface of the semiconductor liner film increases and then decreases as the liner recess moves away from an upper surface of the lower pattern.

6. The semiconductor device of claim 1, wherein the at least one of the plurality of gate structures includes a gate spacer on a sidewall of the gate electrode, the gate spacer includes an inner sidewall facing the gate electrode, an outer sidewall opposite to the inner sidewall of the gate spacer, and a connection sidewall connecting the inner sidewall of the gate spacer and the outer sidewall of the gate spacer to each other, and the semiconductor liner film extends along a portion of the outer sidewall of the gate spacer.

7. The semiconductor device of claim 6, wherein, in a plan view of the semiconductor device, the semiconductor liner film covers a portion of the outer sidewall of the gate spacer and is in contact with the outer sidewall of the gate spacer.

8. The semiconductor device of claim 1, wherein an inner surface of the semiconductor liner film is in contact with the semiconductor filling film.

9. The semiconductor device of claim 8, wherein the source/drain pattern further includes a plurality of semiconductor inserted films spaced apart from each other in the second direction, each of the semiconductor inserted films is arranged between the semiconductor liner film and the semiconductor filling film, each of the semiconductor inserted films includes silicon-germanium, and a fraction of germanium in each of the semiconductor inserted films is greater than a fraction of germanium in the semiconductor liner film and is less than a fraction of germanium in the semiconductor filling film.

10. The semiconductor device of claim 1, wherein the source/drain pattern further includes a semiconductor inserted film continuously along an inner surface of the semiconductor liner film, the semiconductor inserted film includes silicon-germanium, and a fraction of germanium in the semiconductor inserted film is greater than a fraction of germanium in the semiconductor liner film and is less than a fraction of germanium in the semiconductor filling film.

11. The semiconductor device of claim 10, wherein the semiconductor inserted film includes an outer surface facing the inner surface of the semiconductor liner film, and an inner surface facing the semiconductor filling film, and the inner surface of the semiconductor inserted film includes a plurality of convexly-curved face areas and a plurality of concavely-curved face areas.

12. A semiconductor device comprising:

an active pattern including a lower pattern extending in a first direction, and a plurality of sheet patterns spaced apart from the lower pattern in a second direction, wherein the plurality of sheet patterns include an uppermost sheet pattern;

a plurality of gate structures on the lower pattern and spaced apart from each other in the first direction, wherein each of the plurality of gate structures includes a gate spacer, a gate electrode, and a gate insulating film; and a source/drain pattern between adjacent ones of the plurality of gate structures, wherein the source/drain pattern includes a semiconductor liner film and a semiconductor filling film on the semiconductor liner film, wherein the gate spacer includes an inner sidewall facing a sidewall of the gate electrode, an outer sidewall opposite to the inner sidewall of the gate spacer, and a connection sidewall connecting the inner sidewall of the gate spacer and the outer sidewall of the gate spacer to each other, each of the semiconductor liner film and the semiconductor filling film includes silicon-germanium, a fraction of germanium in the semiconductor liner film is less than a fraction of germanium in the semiconductor filling film, a height from an upper surface of the lower pattern to an upper surface of the uppermost sheet pattern is less than a height from the upper surface of the lower pattern to an uppermost level of the semiconductor liner film, and in a plan view of the semiconductor device, the semiconductor liner film covers at least a portion of the outer sidewall of the gate spacer.

13. The semiconductor device of claim 12, wherein the semiconductor liner film includes an outer surface contacting the plurality of sheet patterns and an inner surface facing the semiconductor filling film, and the inner surface of the semiconductor liner film includes a plurality of convexly-curved face areas and a plurality of concavely-curved face areas.

14. The semiconductor device of claim 12, wherein an inner surface of the semiconductor liner film is in contact with the semiconductor filling film.

15. The semiconductor device of claim 12, wherein the source/drain pattern further includes a semiconductor inserted film between the semiconductor liner film and the semiconductor filling film, the semiconductor inserted film includes silicon-germanium, and a fraction of germanium in the semiconductor inserted film is greater than a fraction of germanium in the semiconductor liner film and is less than a fraction of germanium in the semiconductor filling film.

16. The semiconductor device of claim 12, wherein
at least one of the plurality of gate structures includes an inner gate structure between the lower pattern and a lowermost sheet pattern among the plurality of sheet patterns, and an inner gate structure between adjacent ones of the plurality of sheet patterns, wherein each of the inner gate structures includes the gate electrode and the gate insulating film, and
the semiconductor liner film is in contact with the gate insulating film of each of the inner gate structures.

17. A semiconductor device comprising:
an active pattern including a lower pattern extending in a first direction, and a plurality of sheet patterns spaced apart from the lower pattern in a second direction, wherein the plurality of sheet patterns includes an uppermost sheet pattern;
a plurality of gate structures on the lower pattern and spaced apart from each other in the first direction, wherein each of the plurality of gate structures includes a gate electrode and a gate insulating film; and
a source/drain pattern between adjacent ones of the plurality of gate structures, wherein the source/drain pattern includes a semiconductor liner film and a semiconductor filling film on the semiconductor liner film,
wherein a first height from an upper surface of the lower pattern to an upper surface of the uppermost sheet pattern is smaller than a second height from the upper surface of the lower pattern to an uppermost level of the semiconductor liner film,
each of the semiconductor liner film and the semiconductor filling film includes silicon-germanium,
a fraction of germanium in the semiconductor liner film is less than a fraction of germanium in the semiconductor filling film,
the semiconductor liner film includes an outer surface contacting the plurality of sheet patterns and an inner surface facing the semiconductor filling film,
a liner recess defined by the inner surface of the semiconductor liner film includes a plurality of width extension areas, and
a width in the first direction of each of the width extension areas increases and then decreases as each of the width extension areas moves away from the upper surface of the lower pattern.

18. The semiconductor device of claim 17, wherein an entirety of the inner surface of the semiconductor liner film is in contact with the semiconductor filling film.

19. The semiconductor device of claim 17, wherein
the source/drain pattern further includes a semiconductor inserted film between the semiconductor liner film and the semiconductor filling film,
the semiconductor inserted film includes silicon-germanium, and
a fraction of germanium in the semiconductor inserted film is greater than a fraction of germanium in the semiconductor liner film and is less than a fraction of germanium in the semiconductor filling film.

20. The semiconductor device of claim 17, wherein
at least one of the plurality of gate structures includes an inner gate structure between the lower pattern and a lowermost sheet pattern among the plurality of sheet patterns, and an inner gate structure between adjacent ones of the plurality of sheet patterns, wherein each of the inner gate structures includes the gate electrode and the gate insulating film, and
the semiconductor liner film is in contact with the gate insulating film of each of the inner gate structures.

* * * * *